United States Patent
Lin et al.

(10) Patent No.: US 12,372,887 B2
(45) Date of Patent: *Jul. 29, 2025

(54) METHODS OF CLEANING A LITHOGRAPHY SYSTEM

(71) Applicant: Taiwan Semiconductor Manufacturing Company Ltd., Hsinchu (TW)

(72) Inventors: Cho-Ying Lin, Hsinchu (TW); Tai-Yu Chen, Hsinchu (TW); Chieh Hsieh, Hsinchu (TW); Sheng-Kang Yu, Hsinchu (TW); Shang-Chieh Chien, Hsinchu (TW); Li-Jui Chen, Hsinchu (TW); Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/665,461

(22) Filed: May 15, 2024

(65) Prior Publication Data

US 2024/0302755 A1 Sep. 12, 2024

Related U.S. Application Data

(63) Continuation of application No. 17/751,570, filed on May 23, 2022, now Pat. No. 12,019,378.

(51) Int. Cl.
*G03F 7/00* (2006.01)

(52) U.S. Cl.
CPC ...... *G03F 7/70916* (2013.01); *G03F 7/70925* (2013.01)

(58) Field of Classification Search
CPC ............. G03F 7/70175; G03F 7/70916; G03F 7/70925
See application file for complete search history.

(56) References Cited

U.S. PATENT DOCUMENTS

| 12,019,378 | B2 * | 6/2024 | Lin | ...................... G03F 7/70916 |
| 2013/0126761 | A1 * | 5/2013 | Nagai | .................. G02B 5/0891 |
| | | | | 250/504 R |
| 2022/0082927 | A1 * | 3/2022 | Hoshino | ................ H05G 2/008 |
| 2022/0334383 | A1 | 10/2022 | Niimi et al. | |
| 2022/0413400 | A1 | 12/2022 | Liao et al. | |

FOREIGN PATENT DOCUMENTS

JP 2008277529 A 11/2008

* cited by examiner

*Primary Examiner* — Peter B Kim
(74) *Attorney, Agent, or Firm* — Seed IP Law Group LLP

(57) ABSTRACT

A method includes: removing debris on a collector of a lithography equipment by changing physical structure of the debris with a cleaner; forming a cleaned collector by exhausting the removable debris from the collector; and forming openings in a mask layer on a substrate by removing regions of the mask layer exposed to radiation from the cleaned collector.

20 Claims, 17 Drawing Sheets

METHODS OF CLEANING A LITHOGRAPHY SYSTEM

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
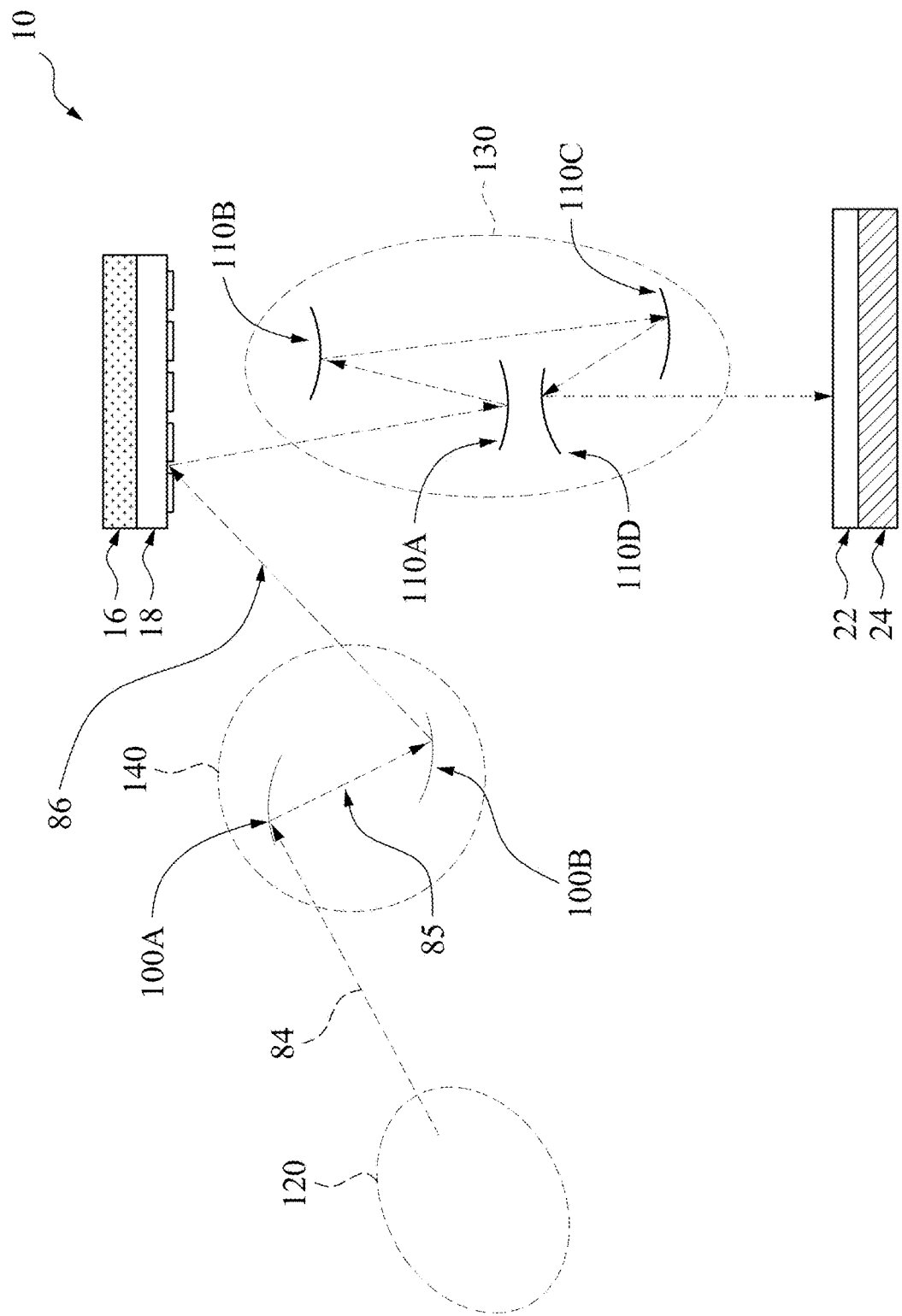
FIGS. 1A-1F are views of portions of a lithography scanner according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

The present disclosure is related to lithography equipment for fabricating semiconductor devices, and more particularly to a collector that is part of a light source and methods of cleaning the collector. Dimension scaling (down) is increasingly difficult in advanced technology nodes. Lithography techniques employ ever shorter exposure wavelengths, including deep ultraviolet (DUV; about 193-248 nanometers), extreme ultraviolet (EUV; about 10-100 nanometers; particularly 13.5 nanometers), and X-ray (about 0.01-10 nanometers) to ensure accurate patterning at the scaled-down dimensions. EUV light is generated by the light source, and reflected toward a wafer by multiple mirrors and a reflective mask. Only a fraction of the EUV light reaches the wafer, such that increasing intensity of EUV light generated by the light source is a topic of much interest.

A typical EUV scanner includes the collector for focusing light scattered from a laser pulse incident on a droplet of material, such as tin. The collector includes a highly-polished mirror surface that is concave with a generally circular cross-section. In most configurations, the collector has an opening located at its center, and a light source, such as a laser, emits one or more laser pulses from behind the collector through the opening to strike the droplet as it traverses space in front of the collector. Debris, such as tin droplets or pests, collects on the collector, causing reduction in EUV conversion efficiency, which lowers wafer per day (WPD) or wafer per hour (WPH) throughput. Cleaning of the collector results in downtime, which lowers throughput. In the embodiments of this disclosure, a collector is cleaned inline to reduce downtime. The cleaning includes transitioning first phase debris to second phase debris by low-temperature cleaner, breaking large debris into small debris by piezo vibrators, or both, and removing the second phase debris, small debris, or both by an exhaust air flow.

FIG. 1A is a schematic and diagrammatic view of a lithography exposure system 10, in accordance with some embodiments. In some embodiments, the lithography exposure system 10 is an extreme ultraviolet (EUV) lithography system designed to expose a resist layer by EUV radiation, and may also be referred to as the EUV system 10. The lithography exposure system 10 includes a light source 120, an illuminator 140, a mask stage 16, a projection optics module (or projection optics box (POB)) 130 and a substrate stage 24, in accordance with some embodiments. The elements of the lithography exposure system 10 can be added to or omitted, and the disclosure should not be limited by the embodiment.

The light source 120 is configured to generate light radiation 84 having a wavelength ranging between about 1 nm and about 100 nm in certain embodiments. In one particular example, the light source 120 generates an EUV radiation 84 with a wavelength centered at about 13.5 nm. Accordingly, the light source 120 is also referred to as an EUV radiation source. However, it should be appreciated that the light source 120 should not be limited to emitting EUV radiation 84. The light source 120 can be utilized to perform any high-intensity photon emission from excited target fuel.

In various embodiments, the illuminator 140 includes various refractive optic components, such as a single lens or a lens system having multiple reflectors 100 (e.g., reflectors 100A, 100B), for example lenses (zone plates) or alternatively reflective optics (for EUV lithography exposure system), such as a single mirror or a mirror system having multiple mirrors in order to direct light from the light source 120 onto the mask stage 16, particularly to a mask 18 secured on the mask stage 16. In the present embodiment where the light source 120 generates light in the EUV wavelength range, reflective optics are employed. The light radiation 84 may be reflected by optics 100A as light radiation 85, which may be reflected by optics 100B as light radiation 86 which is incident on mask 18 and reflected to be incident on optics 110A of POB 130. In some embodiments, the illuminator 140 includes at least three lenses.

The mask stage 16 is configured to secure the mask 18. In some embodiments, the mask stage 16 includes an electrostatic chuck (e-chuck) to secure the mask 18. This is because gas molecules absorb EUV radiation and the lithography exposure system for the EUV lithography patterning is maintained in a vacuum environment to avoid EUV intensity loss. In the present disclosure, the terms mask, photomask, and reticle are used interchangeably. In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multilayer deposited on the substrate.

The projection optics module (or projection optics box (POB)) 130 is configured for imaging the pattern of the mask 18 on to a semiconductor wafer 22 secured on the substrate stage 24 of the lithography exposure system 10. In some embodiments, the POB 130 has refractive optics (such as for a UV lithography exposure system) or alternatively reflective optics (such as for an EUV lithography exposure system) in various embodiments, e.g., optics 110A, 110B, 110C, 110D. The light directed from the mask 18, carrying the image of the pattern defined on the mask, is collected by the POB 130. The illuminator 140 and the POB 130 are collectively referred to as an optical module of the lithography exposure system 10. In some embodiments, the POB 130 includes at least six reflective optics.

In some embodiments, the semiconductor wafer 22 is made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

The semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV radiation. Various components including those described above are integrated together and are operable to perform lithography processes.

The lithography exposure system 10 may include other modules or be integrated with (or be coupled with) other modules, such as a cleaning module designed to provide hydrogen gas to the light source 120. The hydrogen gas helps reduce contamination in the light source 120. Further description of the light source 120 is provided with reference to FIG. 1B.

Figure 1B:
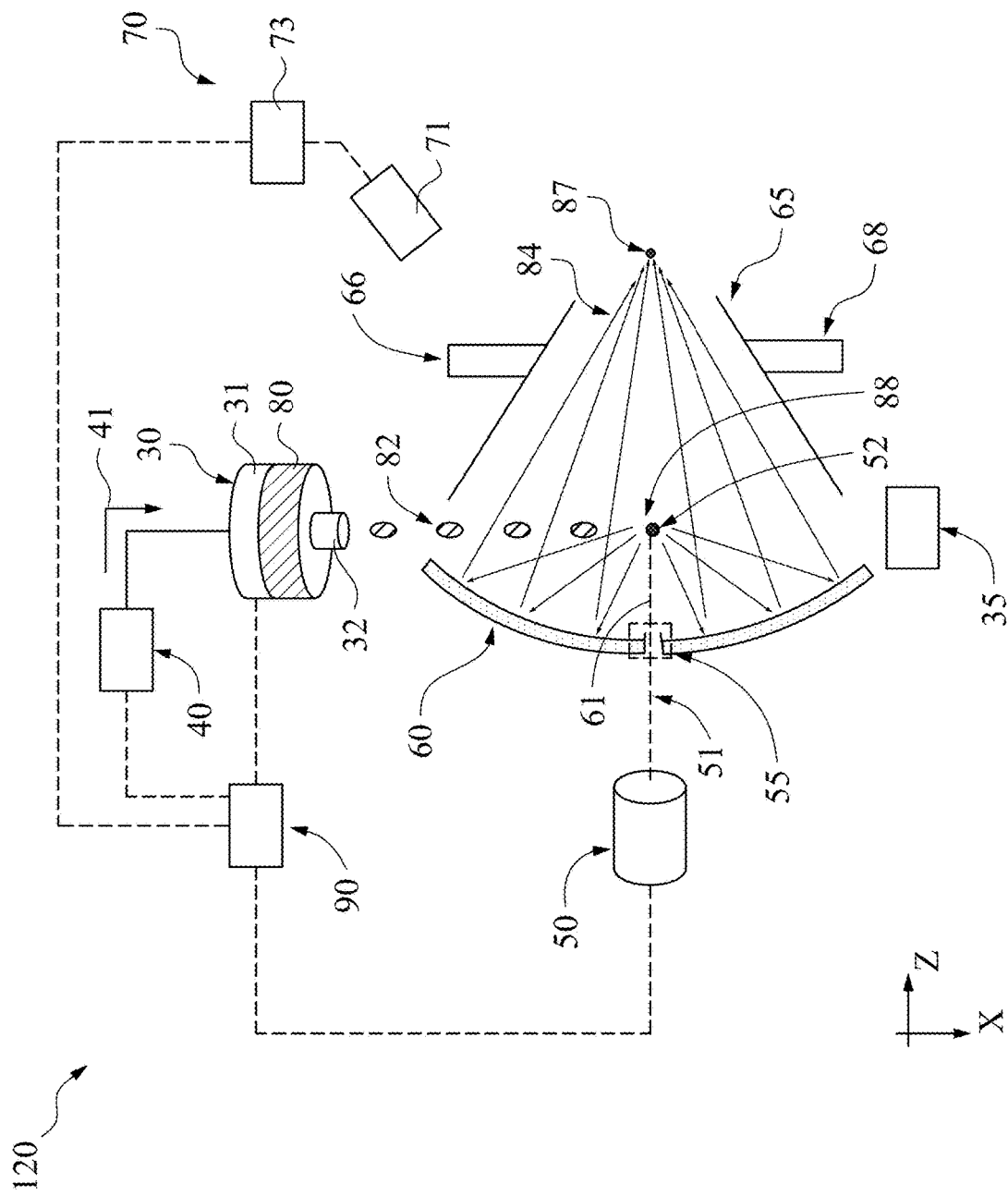

In FIG. 1B, the light source 120 is shown in a diagrammatical view, in accordance with various embodiments. In some embodiments, the light source 120 employs a dual-pulse laser produced plasma (LPP) mechanism to generate plasma 88 and further generate EUV radiation 84 from the plasma 88. The light source 120 includes a droplet generator 30, a droplet receptacle 35, a laser generator 50, a laser produced plasma (LPP) collector 60 (also referred to as "sectional collector 60"), a monitoring device 70 and a controller 90. Some or all of the above-mentioned elements of the light source 120 may be held under vacuum. It should be appreciated that the elements of the light source 120 can be added to or omitted, and should not be limited by the embodiment.

The droplet generator 30 is configured to generate a plurality of droplets 82, which may be elongated, of a target fuel 80 to a zone of excitation at which at least one laser pulse 51 from the laser generator 50 hits the droplets 82 along a Z-axis, as shown in FIG. 1B. In an embodiment, the target fuel 80 includes tin (Sn). In an embodiment, the droplets 82 may be formed with an elliptical shape. In an embodiment, the droplets 82 are generated at a rate of about 50 kilohertz (kHz) and are introduced into the zone of excitation in the light source 120 at a speed of about 70 meters per second (m/s). Other material can also be used for the target fuel 80, for example, a tin containing liquid material such as eutectic alloy containing tin, lithium (Li), and xenon (Xe). The target fuel 80 in the droplet generator 30 may be in a liquid phase.

The laser generator 50 is configured to generate at least one laser pulse to allow the conversion of the droplets 82 into plasma 88. In some embodiments, the laser generator 50 is configured to produce a laser pulse 51 to the lighting point 52 to convert the droplets 82 to plasma 88 which generates EUV radiation 84. The laser pulse 51 is directed through window (or lens) 55, and irradiates droplets 82 at the lighting point 52. The window 55 is formed in the sectional collector 60 and adopts a suitable material substantially transparent to the laser pulse 51. The droplet receptacle 35 catches and collects unused droplets 82 and/or scattered material of the droplets 82 resulting from the laser pulse 51 striking the droplets 82.

The plasma emits EUV radiation 84, which is collected by the collector 60 and directed toward a focal point 87. The collector 60 further reflects and focuses the EUV radiation 84 for the lithography processes performed through an exposure tool. In some embodiments, the collector 60 has an optical axis 61 which is parallel to the Z-axis direction and perpendicular to the Z-axis direction. In some embodiments, the collector 60 includes at least two collector sections, such as collector sections 60A-60C illustrated in FIG. 1C, and described in detail with reference to FIGS. 1C and 1D. The collector 60 (or sectional collector 60) may include a vessel wall 65 having first and second pumps 66, 68 attached thereto. In some embodiments, the first and second pumps 66, 68 include scrubbers configured to remove particulates and/or gases from the collector 60. The first and second pumps 66, 68 may be collectively referred to as "the pumps 66, 68" herein.

In some embodiments, the laser generator 50 is a carbon dioxide ($CO2$) laser source. In some embodiments, the laser generator 50 is used to generate the laser pulse 51 with single wavelength. The laser pulse 51 is transmitted through an optic assembly for focusing and determining incident angle of the laser pulse 51. In some embodiments, the laser pulse 51 has a spot size of about 200-300 μm, such as 225 μm. The laser pulse 51 is generated to have certain driving power to meet wafer production targets, such as a throughput of 125 wafers per hour (WPH), though greater WPH may be achieved, for example, by use of the sectional collector 60 which increases throughput by its larger surface area. In some embodiments, the laser pulse 51 is equipped with about 23 kW driving power. In various embodiments, the driving power of the laser pulse 51 is at least 20 kW, such as 27 kW.

The monitoring device 70 is configured to monitor one or more conditions in the light source 120 so as to produce data for controlling configurable parameters of the light source 120. In some embodiments, the monitoring device 70 includes a metrology tool 71 and an analyzer 73. In cases where the metrology tool 71 is configured to monitor condition of the droplets 82 supplied by the droplet generator 30, the metrology tool may include an image sensor, such as a charge coupled device (CCD), complementary metal oxide semiconductor (CMOS) sensor or the like. The metrology tool 71 produces a monitoring image including image or video of the droplets 82 and transmits the monitoring image to the analyzer 73. In cases where the metrology tool 71 is configured to detect energy or intensity of the EUV light 84 produced by the droplet 82 in the light source 12, the meteorology tool 71 may include a number of energy sensors. The energy sensors may be any suitable sensors that are able to observe and measure energy of electromagnetic radiation in the ultraviolet region.

The analyzer 73 is configured to analyze signals produced by the metrology tool 71 and outputs a detection signal to the controller 90 according to an analyzing result. For example, the analyzer 73 includes an image analyzer. The analyzer 73 receives the data associated with the images transmitted from the metrology tool 71 and performs an image analysis process on the images of the droplets 82 in the excitation zone. Afterwards, the analyzer 73 sends data related to the analysis to the controller 90. The analysis may include a flow path error or a position error.

In some embodiments, two or more metrology tools 71 are used to monitor different conditions of the light source 120. One is configured to monitor condition of the droplets 82 supplied by the droplet generator 30, and the other is configured to detect energy or intensity of the EUV light 84 produced by the droplet 82 in the light source 120. In some embodiments, the metrology tool 71 is a final focus module (FFM) and positioned in the laser source 50 to detect light reflected from the droplet 82.

The controller 90 is configured to control one or more elements of the light source 120. In some embodiments, the controller 90 is configured to drive the droplet generator 30 to generate the droplets 82. In addition, the controller 90 is configured to drive the laser generator 50 to fire the laser pulse 51. The generation of the laser pulse 51 may be controlled to be associated with the generation of droplets 82 by the controller 90 so as to make the laser pulse 51 hit each target 82 in sequence.

In some embodiments, the droplet generator 30 includes a reservoir 31 and a nozzle assembly 32. The reservoir 31 is configured for holding the target material 80. In some embodiments, one gas line 41 is connected to the reservoir 31 for introducing pumping gas, such as argon, from a gas source 40 into the reservoir 31. By controlling the gas flow in the gas line 41, the pressure in the reservoir 31 can be manipulated. For example, when gas is continuously supplied into the reservoir 31 via the gas line 41, the pressure in the reservoir 31 increases. As a result, the target material 80 in the reservoir 31 can be forced out of the reservoir 31 in the form of droplets 82.

Figure 1D:
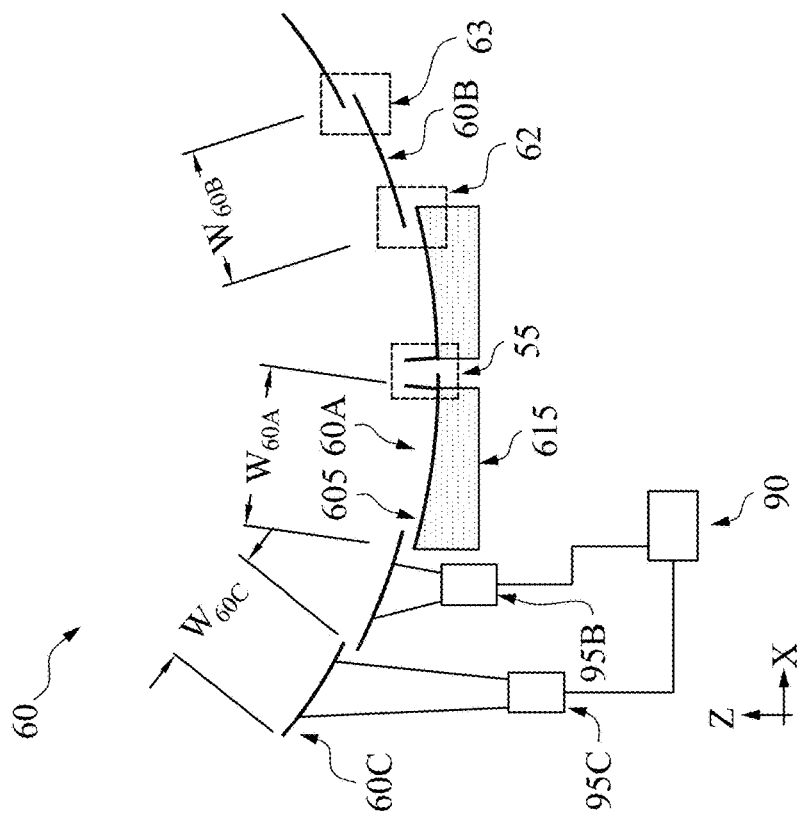
Figure 1C:
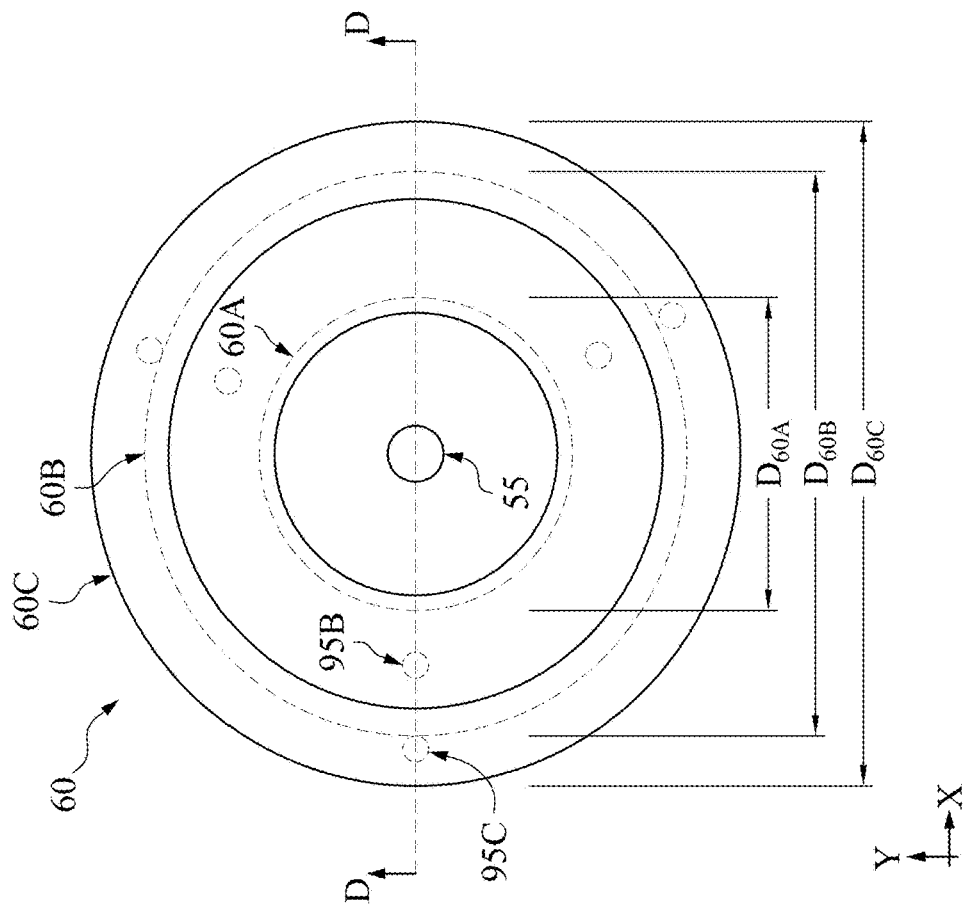

FIGS. 1C and 1D are views of the sectional collector 60 in accordance with various embodiments. FIG. 1C is a top view of the sectional collector 60. FIG. 1D is a cross-sectional view of the sectional collector 60 along the line D-D shown in FIG. 1C.

In FIG. 1C, the sectional collector 60 is shown including three collector sections 60A, 60B, 60C. The collector section 60A is substantially mirror-polished, includes an upper portion 605 facing the droplets 82, a support portion 615 configured to support the upper portion 605, and is positioned in a central region of the sectional collector 60. In some embodiments, the upper portion 605 and the support portion 615 are monolithically formed. In some embodiments, the support portion 615 encloses and/or secures the upper portion 605, for example by clamps or other securing structure holding the outer edge of the upper portion 605.

In some embodiments, the collector section 60A includes material such as stainless steel, or the like, and may further include one or more coatings of another material, such as Ru, $ZrN/ZrO_2$ multilayers, or other suitable material for providing a mirror surface. In some embodiments, the material has Young's Modulus greater than about 200 GPa. The collector section 60A has diameter $D_{60A}$, which may be uniform for the entire collector section 60A, in some embodiments. In some other embodiments, the diameter $D_{60A}$ may be one of at least two diameters of the collector section 60A. For example, for the collector section 60A that has elliptical cross-section normal to the Z-axis, the diameter $D_{60A}$ may be a major diameter (or "major axis") or a minor diameter (or "minor axis"). In some embodiments, the diameter $D_{60A}$ is in a range of about 100 mm to about 600 mm (e.g., about 400 mm), though larger or smaller diameters may be desirable in other embodiments. The collector section 60A includes the window 55, which is substantially positioned at the center of the collector section 60A, in some embodiments. As shown in FIG. 1D, the collector section 60A further has width $W_{60A}$, which is a distance between the outer edge of the collector section 60A and the outer edge of the window 55 at the surface of the collector section 60A facing the laser generator 50. In some embodiments, the width $W_{60A}$ is substantially uniform over the entire collector section 60A.

In some embodiments, the collector section 60A is positioned nearest the laser generator 50, and furthest the droplet 82, along the Z-axis, of the three collector sections 60A-60C. In some embodiments, the Z-axis, which is parallel to the central (or "optical") axis 61 (see FIG. 1B) of the sectional collector 60, is parallel to Earth's gravity, or perpendicular to Earth's gravity, though other orientations may also be desirable depending on, for example, position of the sectional collector 60 in the lithography system 10. Configuring the optical axis 61 of the sectional collector 60 to be perpendicular to Earth's gravity may simplify calculation of path of motion of the droplets 82, as the droplets 82 may travel in a direction generally parallel to the Earth's gravity.

The collector section 60B is substantially mirror-polished, and is positioned offset from the collector section 60A, as shown in FIG. 1D. In the orientation shown in FIG. 1D, the collector section 60B is offset from the collector section 60A along the Z direction. The collector section 60B is positioned in a first peripheral region of the sectional collector 60. In some embodiments, the collector section 60B includes material such as stainless steel, or the like. In some embodiments, the material has Young's Modulus greater than about 200 GPa. The collector section 60B may further include one or more coatings of another material, such as Ru, $ZrN/ZrO_2$ multilayers, or other suitable material for providing a mirror surface. The collector section 60B has diameter $D_{60B}$, which may be uniform for the entire collector section 60B, in some embodiments. In some other embodiments, the diameter $D_{60B}$ may be one of at least two diameters of the collector section 60B. For example, for the collector section 60B that has elliptical cross-section normal to the Z-axis, the diameter $D_{60B}$ may be a major diameter (or "major axis") or a minor diameter (or "minor axis"). In some embodiments, the diameter $D_{60B}$ is in a range of about 200 mm to about 800 mm, though larger or smaller diameters may be desirable in other embodiments. The collector section 60B is generally ring-shaped, having an inner edge and an outer edge (outer edge is depicted in phantom in FIG. 1C), and may be substantially aligned with the center of the collector section 60A, in some embodiments. As shown in FIG. 1D, the collector section 60B further has width $W_{60B}$, which is a distance between the outer edge of the collector section 60B and the inner edge of the collector section 60B. The inner edge of the collector section 60B overlaps the outer edge of the collector section 60A in an overlap region 62 depicted in FIG. 1D. The overlap region 62 is configured to allow flow of air or a gas into and/or from a gap between surfaces of the collector section 60B and the collector section 60A. In some embodiments, the width $W_{60A}$ is substantially uniform over the entire collector section 60A. The collector section 60B is configured to reflect a first set of photons corresponding to the central region of the sectional collector 60. Position and/or angle of the collector section 60B may be selected by an actuator 95B in contact therewith and controlled by controller 90.

The collector section 60C is substantially mirror-polished, and is positioned offset from the collector section 60B, as shown in FIG. 1D. In the orientation shown in FIG. 1D, the collector section 60C is offset from the collector section 60B along the Z direction. The collector section 60C is positioned in a second peripheral region of the sectional collector 60. The first peripheral region is generally between the central region and the second peripheral region. In some embodiments, the collector section 60C includes material such as stainless steel, or the like. In some embodiments, the material has Young's Modulus greater than about 200 GPa. The collector section may further include one or more coatings of another material, such as Ru, $ZrN/ZrO_2$ multilayers, or other suitable material for providing a mirror surface. The collector section 60C has diameter $D_{60C}$, which may be uniform for the entire collector section 60C, in some embodiments. In some other embodiments, the diameter Doc may be one of at least two diameters of the collector section 60C. For example, for the collector section 60C that has elliptical cross-section normal to the Z-axis, the diameter $D_{60C}$ may be a major diameter (or "major axis") or a minor diameter (or "minor axis"). In some embodiments, the diameter $D_{60C}$ is in a range of about 300 mm to about 1000 mm, though larger or smaller diameters may be desirable in other embodiments. The collector section 60C is generally ring-shaped, having an inner edge and an outer edge (outer edge is depicted in phantom in FIG. 1C), and may be substantially aligned with the center of the collector section 60A, in some embodiments. As shown in FIG. 1D, the collector section 60C has width $W_{60C}$, which is a distance between the outer edge of the collector section 60C and the inner edge of the collector section 60C. The inner edge of the collector section 60C overlaps the outer edge of the collector section 60B in an overlap region 63 depicted in FIG. 1D. The overlap region 63 is configured to allow flow of air or a gas into and/or from a gap between surfaces of the collector section 60B and the collector section 60A. In some embodiments, the width $W_{60C}$ is substantially uniform over the entire collector section 60C. The collector section 60C is configured to reflect a first set of photons corresponding to the central region of the sectional collector 60. Position and/or angle of the collector section 60C may be selected by an actuator 95C in contact therewith and controlled by controller 90.

In some embodiments, the width $W_{60A}$ of the collector section 60A corresponding to the central region is substantially equal to the widths $W_{60B}$, $W_{60C}$ of the collector sections 60B, 60C corresponding to the first and second peripheral regions, respectively. In some embodiments, the width $W_{60A}$ is in a range of about 50 mm to about 300 mm. In some embodiments, the widths $W_{60B}$, $W_{60C}$ are each in a range of about 50 mm to about 300 mm. In some embodiments, the widths $W_{60B}$, $W_{60C}$ are about 100 mm. In some embodiments, at least one of the widths $W_{60A}$-$W_{60C}$ is different from the other of the widths $W_{60A}$-$W_{60C}$. For example, to avoid deformation due to self-weight, it may be desirable for peripherally-located collector sections, such as the collector sections 60B, 60C, to have similar width to, or lower width than, the centrally-located collector section(s), such as the collector section 60A. In such embodiments, the width $W_{60C}$ may be less than the width $W_{60B}$, which may be less than the width $W_{60A}$. In some embodiments, either of the widths $W_{60B}$, $W_{60C}$ is less than the width $W_{60A}$ by an amount in a range from about 20 mm to about 300 mm. In some embodiments, variance among the widths $W_{60A}$-$W_{60C}$ may be less than about 50%, less than about 30% or less than about 10%. Generally, if variance exists among the widths $W_{60A}$-$W_{60C}$, the width $W_{60A}$ is greater than either or both of the widths $W_{60B}$, $W_{60C}$ to avoid deformation of the collector sections 60B, 60C located more peripherally in the sectional collector 60. For example, a ratio of width $W_{60A}$ over width $W_{60B}$ or width $W_{60C}$ may be in a range of about 1 to about 1.5. A ratio of width $W_{60B}$ over width $W_{60C}$ may be in a range of about 0.7 to about 1.5, in some embodiments. In some embodiments, widths $W_{60A}$, $W_{60B}$, $W_{60C}$ may be in a ratio of about 1:0.8:0.8.

Figure 1E:
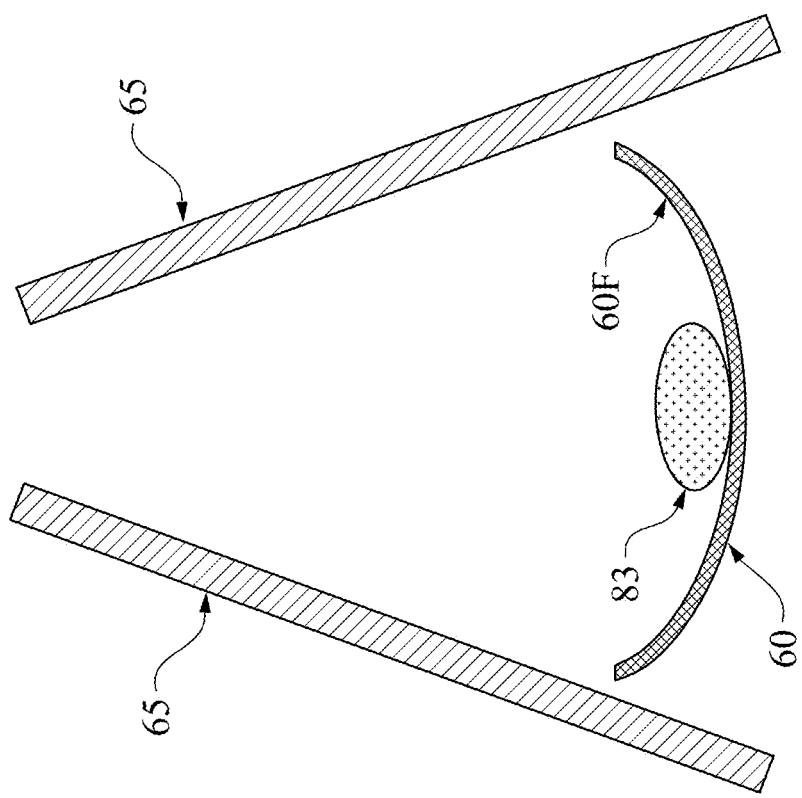

In FIG. 1E, during operation of the light source 120, contaminants may settle on the mirror surface of the collector 60 or sectional collector 60. Over time, the contaminants may accumulate on the mirror surface, which may lead to non-uniformity of the radiation 84 generated by the light source 120 due to changes in reflectivity and/or surface topology of the collector 60. The contaminants may include tin debris in the form of drops, drips, haze, combinations thereof or the like. Embodiments of the disclosure include systems and methods for cleaning the surface of the collector 60 or the sectional collector 60.

As shown in FIG. 1E, a drop 83 is present on a front surface 60F of the collector 60. The drop 83 may be tin. When the drop 83 is tin, the tin is beta-tin (or "β-Sn"). Beta-tin is generally difficult to remove. Large drops 83 of Sn contamination degrades collector reflectivity at a level of as much as 1%-3% reflectivity lost per drop 83. The drops 83 may be dropped from the vanes or scrubber, and are difficult to remove by self-cleaning methods of the lithography exposure system 10. Tin contamination such as the drop 83 may also dominate an optical proximity correction (OPC) model. Reduced reflectivity and inaccurate OPC model may lead to replacement of the collector 60, which is a lengthy process that increases downtime of the lithography exposure system 10.

Tin pest is an autocatalytic, allotropic transformation of tin that leads to deterioration of tin objects, such as the drop 83, at low temperatures. Tin has two kinds of crystal based on temperature: at temperature above 13° C., silvery-white crystal called beta-tin has body-centered tetragonal structure; at temperatures increasingly below 13° C., the crystal gradually cracks and begins to transform into its allotrope gray tin (alpha-tin) having diamond structure. The conversion speed can be very slow. Once the temperature drops to about −33° C., volume increases by about 27%, and the crystal cracks and becomes powdery.

Figure 1F:
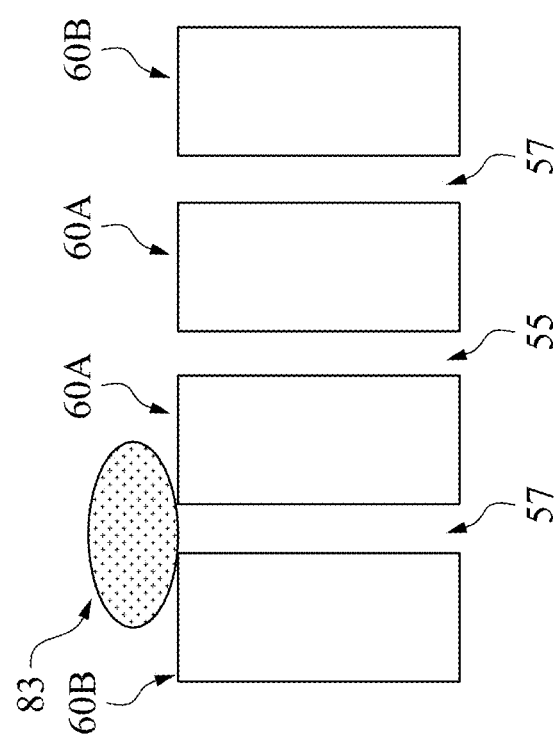

FIG. 1F shows the drop 83 on the sectional collector 60, for example, overlying the collector sections 60A, 60B. In some embodiments, the drop 83 overlies (e.g., bridges) a gap 57 between the collector sections 60A, 60B.

Figure 2:
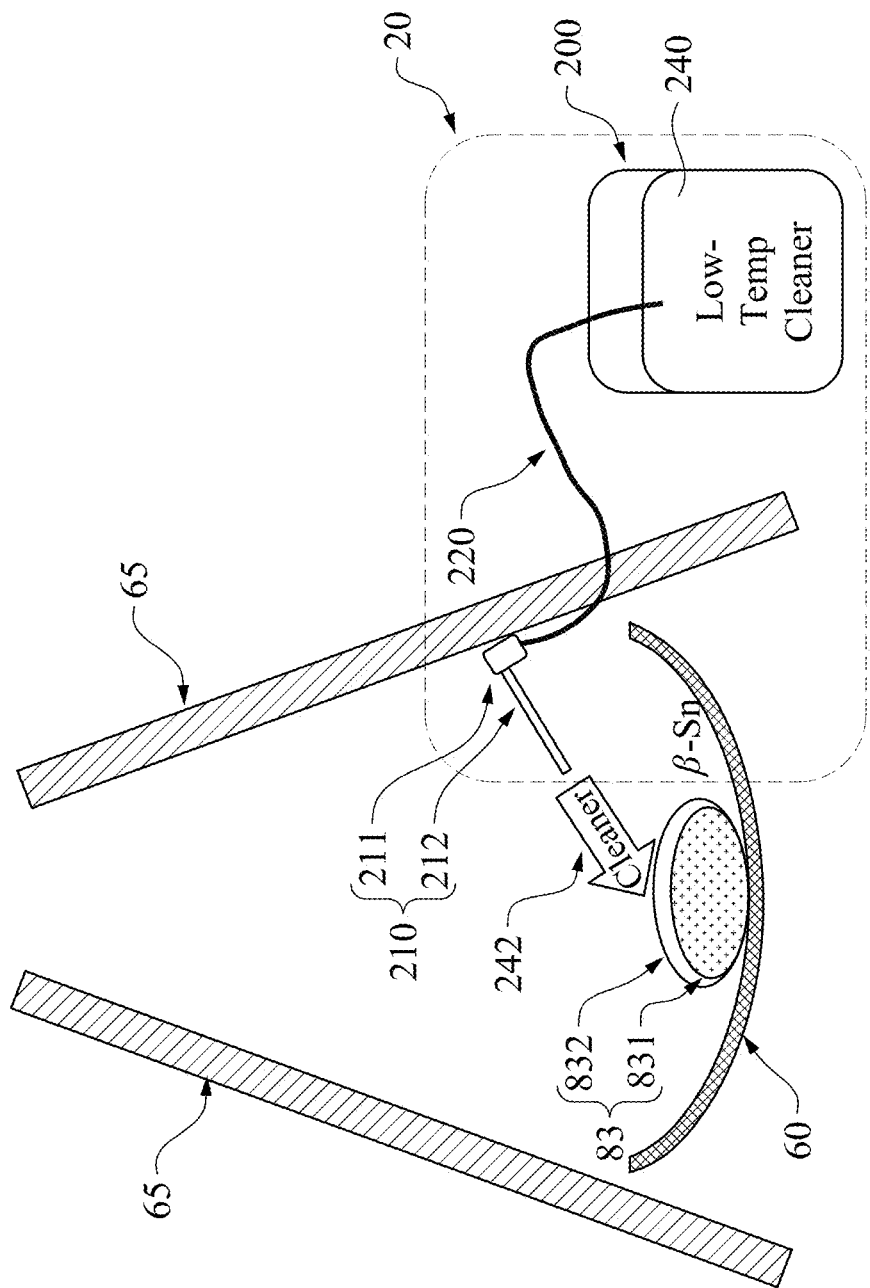
FIGS. 2-7C are views of cleaning a mirror according to various embodiments of the present disclosure.

FIG. 2 illustrates a cleaning system 20 configured to remove the drop 83 in accordance with various embodiments. In some embodiments, the cleaning system 20 includes a container 200, a dispenser 210 and a hose, tube or pipe 220. The container 200 is in fluid communication with the dispenser 210 by the hose 220. The container 200 contains cleaner 240. In some embodiments, the cleaner 240 is hydrogen gas, such as chilled $H_2$.

The cleaner 240 is chilled to a temperature sufficient to induce a transition in phase in the drop 83. In some embodiments, the cleaner 240 is at a temperature less than about 13° C., such as less than about 0° C., less than about −33° C., or less than about −45° C. In some embodiments, the cleaner 240 is at a temperature of about −40° C. (e.g., about 233 degrees Kelvin).

The pipe 220 extends from the container 200 to the dispenser 210. In some embodiments, the pipe 220 extends into the container 200. The pipe 220 may be flexible, rigid, or a combination of both. The pipe 220 may include a metal, rubber, plastic, or other suitable material for conducting chilled cleaner. The pipe 220 may be insulated. The pipe 220 is coupled to the dispenser 210 for conducting chilled cleaner 240 to the dispenser 210 from the container 200.

The dispenser 210 may be a squeeze jet or other appropriate dispenser capable of adjusting nozzle direction and flow magnitude. The dispenser 210 is positioned above the reflecting surface of the collector 60, and faces the reflecting surface of the collector 60. In some embodiments, the dispenser 210 includes a pump 211 and a nozzle 212. The pump 211 may be controlled electronically, and may be used to output the cleaner 240 at a selected flow magnitude. The nozzle 212 is coupled to the pump 211, and may have selectable direction. For example, the nozzle 212 may swivel to point a tip of the nozzle 212 toward a selected point or region of the collector 60.

In operation, the dispenser 210 may draw a volume of cleaner 240 and direct a stream 242 of the cleaner 240 toward the droplet 83. The stream 242 may be directed by the dispenser 210 toward an upper surface of the droplet 83, the upper surface facing the dispenser 210 and facing away from the reflecting surface of the collector 60. After a period of time, the cleaner 240 that is chilled to a low temperature cools material of the droplet 83 near the upper surface of the droplet 83. As the material near the upper surface is cooled, first phase material or first phase debris 831 transitions to second phase material or second phase debris 832. In some embodiments, the droplet 83 is tin, the first phase debris 831 is beta-tin, and the second phase debris 832 is alpha-tin. The second phase debris 832 develops cracks and becomes powdery. After a selected period of time, some or all of the first phase debris 831 is transformed to the second phase debris 832. The second phase debris 832 may be removed by directed gas or liquid flow toward the second phase debris 832. In some embodiments, the second phase debris 832 is removed by the stream 242, for example, if the flow magnitude of the stream 242 is sufficient to detach the second phase debris 832 from the droplet 83. In some embodiments, another gas or liquid is used instead of the cleaner 240 to remove the second phase debris 832. For example, a high hydrogen flow gas at room temperature may be directed toward the second phase debris 832 to remove the second phase debris 832 from the collector 60. The inline cleaning method illustrated in FIG. 2 reduces tool downtime, as the collector 60 is cleaned without removing the collector from the tool for cleaning. As such, wafer throughput is improved.

Figure 3:
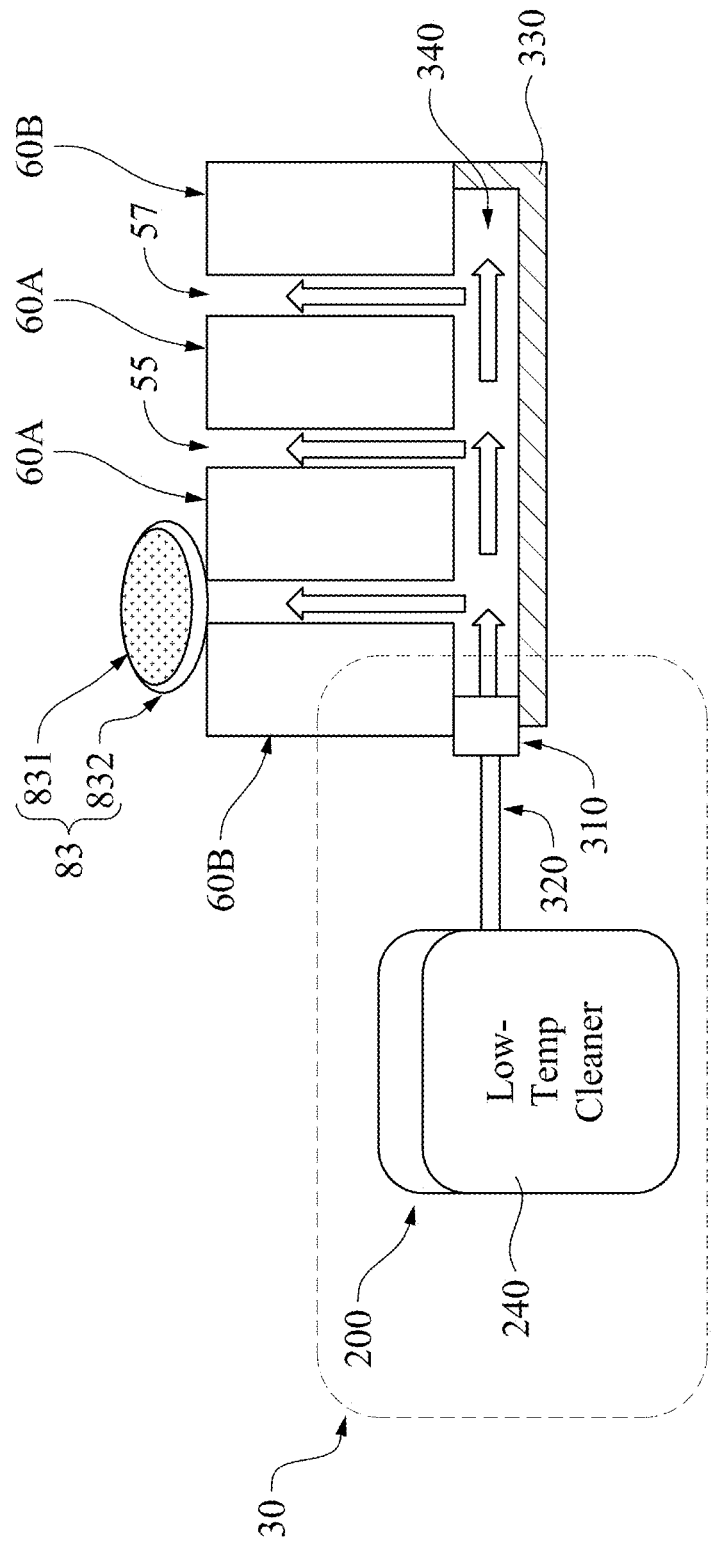

FIG. 3 illustrates a cleaning system 30 configured to remove the drop 83 in accordance with various embodiments. The cleaning system 30 includes the container 200, a dispenser 310 and a hose, tube or pipe 320. The container 200 is in fluid communication with the dispenser 310 by the pipe 320. The container 200 contains cleaner 240. In some embodiments, the cleaner 240 is hydrogen gas, such as chilled $H_2$. The cleaning system 30, in operation, expels the cleaner 240 toward the backside of the sectional collector 60, such that the cleaner 240 at low temperature (e.g., <−40° C.) flows toward the underside of the drop 83 by flowing through a space 340 beneath the sectional collector 60, into the gaps 57 and the window 55, and toward the front side of the sectional collector 60.

As shown in FIG. 3, the drop 83 is near one of the gaps 57 or near the window 55. As such, the underside of the drop 83, which faces the reflecting surface of the sectional collector 60, may be chilled by the cleaner 240 when the cleaner 240 flows through the gaps 57 or the window 55. In some embodiments, the cleaner 240 is chilled, pressurized, or both by the container 200. The cleaner 240 may be expelled from the dispenser 310 by opening a valve. In some embodiments, the dispenser 310 includes a pump, and the cleaner 240 is expelled by action of the pump. Flow rate of the cleaner 240 out of the dispenser 310 may be selected, for example, by a controller, such as a digital control circuit electrically coupled to the cleaning system 30.

The cleaner 240 is expelled in gas form into the space 340. The space 340 is present between the sectional collector 60 and a housing 330. In some embodiments, the housing 330 is sealed to direct the cleaner 240 through the gaps 57 and the window 55. In some embodiments, the housing 330 includes a port for exhausting cleaner 240, debris or both. The port may be opened or closed by a second valve (see, for example, FIGS. 7B and 7C).

When the drop 83 is contacted by the cleaner 240 at the low temperature, temperature of the drop 83 decreases. The underside of the drop 83 facing the reflecting surface of the sectional collector 60 cools more rapidly than the topside of the drop 83 facing away from the reflecting surface. As such, material near the underside of the drop 83 transitions from the first phase material 831 (e.g., beta-tin) to the second phase material 832 (e.g., alpha-tin) before material near the topside of the drop 83. The drop 83 may break up into removable debris prior to, upon, or following full transition of the drop 83 from the first phase material 831 to the second phase material 832. The removable debris may be removed by any of the processes described with reference to FIG. 2.

Figure 4:
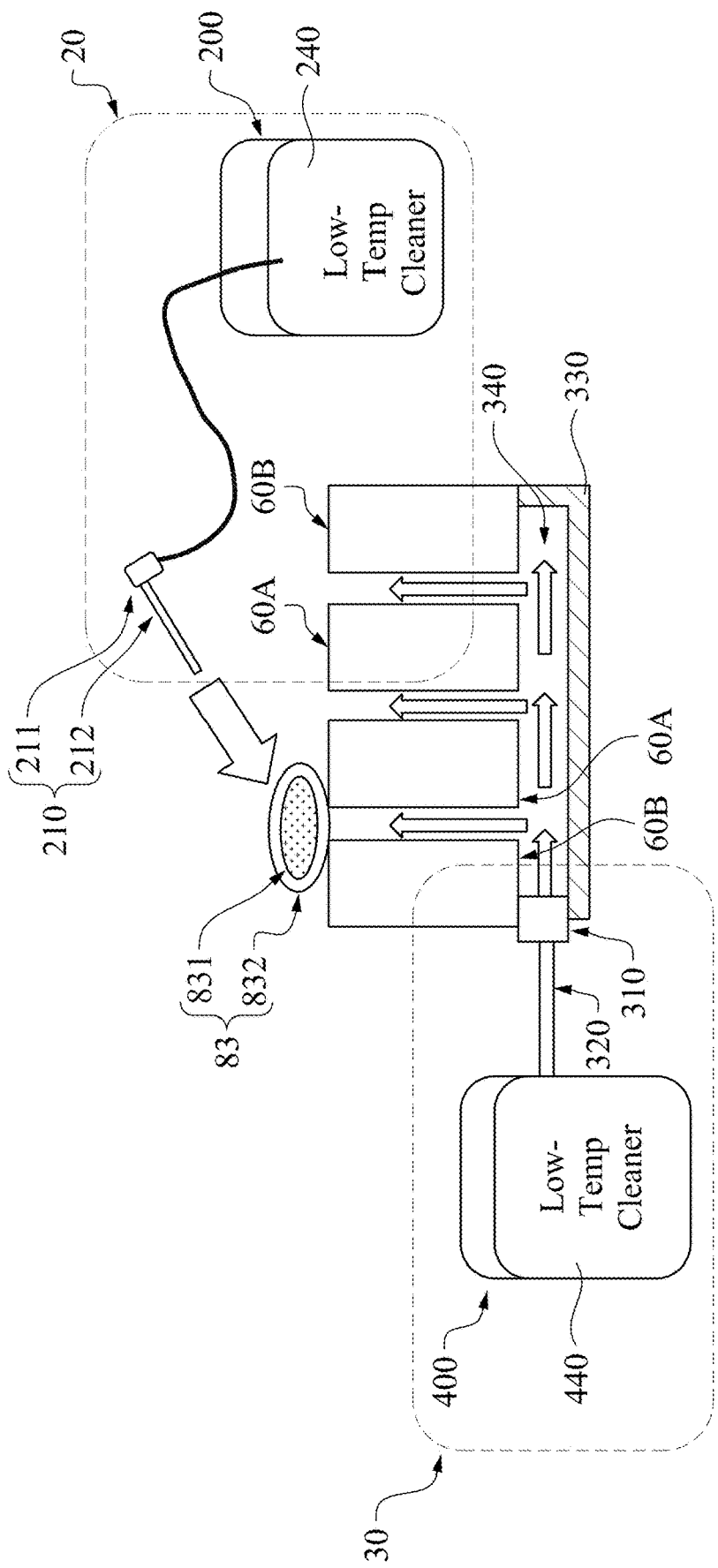

FIG. 4 is a diagram illustrating use of the cleaning systems 20, 30 to remove the drop 83 in accordance with various embodiments. In FIG. 4, the cleaning system 20 expels the cleaner 240 toward the topside of the drop 83, and the cleaning system 30 expels cleaner 440 toward the underside of the drop 83. The cleaner 440 may be the same as or substantially the same as the cleaner 240. The cleaner 440 is contained in a container 400. In some embodiments, the container 400 and the container 200 are the same container. In some embodiments, the container 400 is separate from the container 200. Flow rate of the cleaner 240 from the container 200 through the dispenser 210 may be the same, substantially the same, or different than flow rate of the cleaner 440 from the container 400 through the dispenser 310.

By using the cleaning systems 20, 30 in conjunction, the drop 83 may be cooled from the underside and the topside, which may enhance speed, uniformity, or both of the transition from the first phase material 831 to the second phase material 832. In some embodiments, the transition forms a shell of the second phase material 832 around the first phase material 831, as shown in FIG. 4. The drop 83 may break up into removable debris prior to, upon, or following full transition of the drop 83 from the first phase material 831 to the second phase material 832. The removable debris may be removed by any of the processes described with reference to FIG. 2.

Figure 5B:
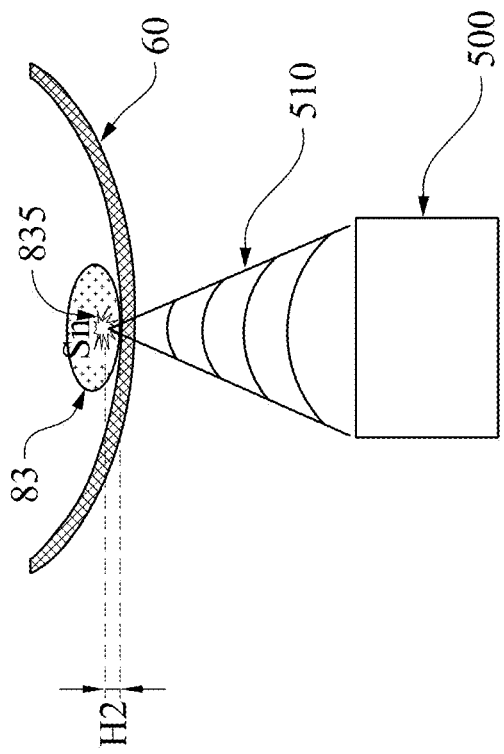
Figure 5A:
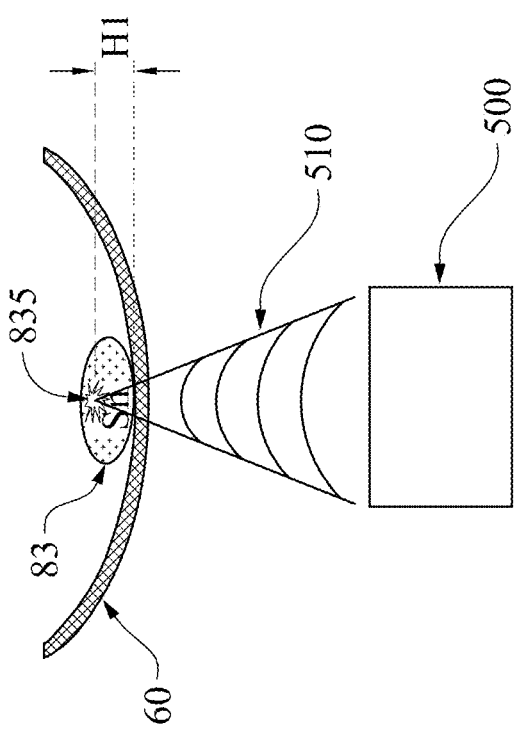

FIGS. 5A and 5B are diagrams illustrating use of a cleaning system 500 for breaking up the drop 83 in accordance with various embodiments. The cleaning system 500 may be or include a shockwave generator, and may be referred to as the shockwave generator 500. The shockwave generator 500 generates shock waves 510 that may be directed onto a region 835 (e.g., a point) of the drop 83. The shock waves 510 generate localized pressure at the region 835, which may form fractures that weaken or break the drop 83.

FIGS. 5A and 5B illustrate that the shock waves 510 generated by the shock wave generator 500 may be focused on regions 835 of selected distance from the reflecting surface of the collector 60 or the sectional collector 60. In FIG. 5A, the shock waves 510 are incident on the region 835 at a distance H1 from the reflecting surface of the collector 60 or the sectional collector 60. In FIG. 5B, the shock waves 510 are incident on the region 835 at a different (e.g., shorter) distance H2 from the reflecting surface of the collector 60 or the sectional collector 60. The distances H1, H2 may be selected based on one or more factors, include size (e.g., volume or mass) of the drop 83, orientation of the drop 83 relative to incident direction of the shock waves 510, or other appropriate factors. In some embodiments, the distance (e.g., H1) is varied over duration of applying the shock waves 510. For example, the shock waves 510 may be scanned along one or more spatial dimensions (e.g., vertical dimension or lateral dimensions) over time to be incident on multiple regions 835 within the drop 83. In some embodiments, amplitude of the shock waves 510 may be selected based on one or more factors, such as position of the region 835 in the drop 83. Control of the amplitude, distance H1, H2, a scan path, or a combination thereof of the shock waves 510 may be performed as described with reference to FIGS. 8A-8D.

Figure 6B:
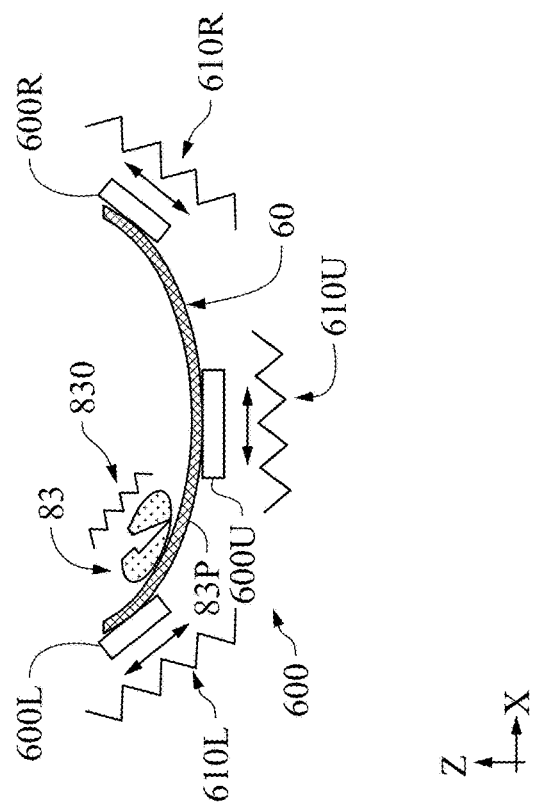
Figure 6A:
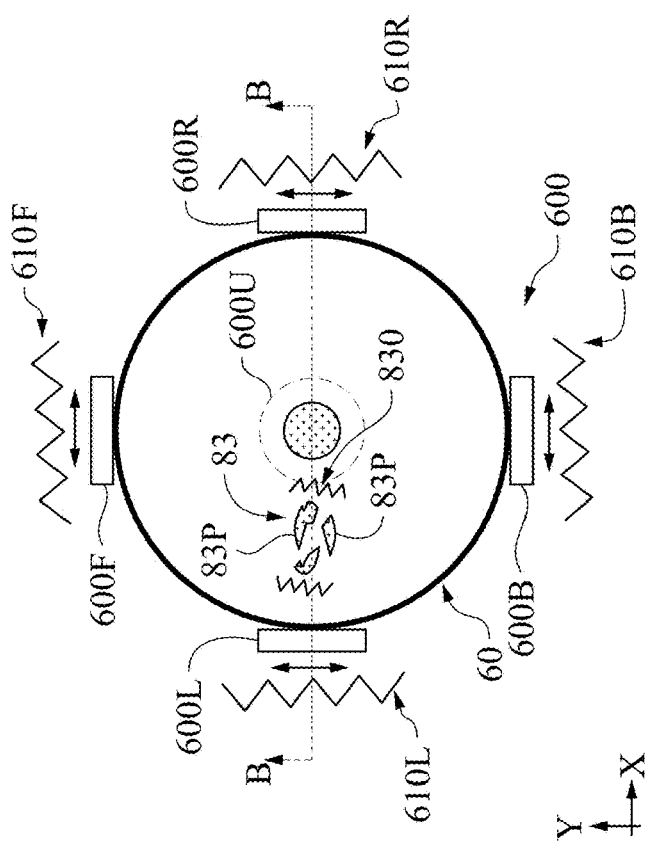

FIGS. 6A, 6B illustrate use of vibrators for breaking up the drop 83 in accordance with various embodiments. FIG. 6A is a top-down view of the collector 60. FIG. 6B is a cross-sectional side view of the collector 60 along line B-B of FIG. 6A. Description is given with reference to the collector 60, and is also applicable to the sectional collector 60.

Vibration 830 on the collector or sectional collector 60 may be used to break up the drop 83. The vibration 830 may be generated by vibrators 600L, 600R, 600F, 600B, 600U mounted on the collector 60. The vibrators 600L, 600R, 600F, 600B, 600U may be referred to collectively as the vibrators 600. The vibrators 600 generate vibrations 610L, 610R, 610F, 610B, 610U, which may be referred to collectively as the vibrations 610.

A left-side vibrator 600L is mounted to a left side of the collector 60. The left-side vibrator 600L may be a piezoelectric vibrator, eccentric rotating mass (ERM) vibrator, linear resonant actuator or other suitable vibrator. The left-side vibrator 600L may be controllable by an electrical signal. In some embodiments, amplitude of right-side vibration 610L, duration of right-side vibration 610L, or both are controlled by the electrical signal (or signals). Control of the amplitude, duration or both of the left-side vibration 610L may be by an analog electrical signal, a digital electrical signal, or both.

A right-side vibrator 600R is mounted to a right side of the collector 60, for example, on an opposite side of the collector 60 from the left-side vibrator 600L. The right-side vibrator 600R may be a piezoelectric vibrator, eccentric rotating mass (ERM) vibrator, linear resonant actuator or other suitable vibrator. The right-side vibrator 600R may be controllable by an electrical signal. In some embodiments, amplitude of right-side vibration 610R, duration of right-side vibration 610R, or both are controlled by the electrical signal (or signals). Control of the amplitude, duration or both of the right-side vibration 610R may be by an analog electrical signal, a digital electrical signal, or both.

A front-side vibrator 600F is mounted to a front side of the collector 60, for example, on a side of the collector 60 between the right-side vibrator 600R and the left-side vibrator 600L. The front-side vibrator 600F may be a piezoelectric vibrator, eccentric rotating mass (ERM) vibrator, linear resonant actuator or other suitable vibrator. The front-side vibrator 600F may be controllable by an electrical signal. In some embodiments, amplitude of front-side vibration 610F, duration of front-side vibration 610F, or both are controlled by the electrical signal (or signals). Control of the amplitude, duration or both of the front-side vibration 610F may be by an analog electrical signal, a digital electrical signal, or both.

A back-side vibrator 600B is mounted to a back side of the collector 60, for example, on a side of the collector 60 between the right-side vibrator 600R and the left-side vibrator 600L and opposite the front-side vibrator 600F. The back-side vibrator 600B may be a piezoelectric vibrator, eccentric rotating mass (ERM) vibrator, linear resonant actuator or other suitable vibrator. The back-side vibrator 600B may be controllable by an electrical signal. In some embodiments, amplitude of back-side vibration 610B, duration of back-side vibration 610B, or both are controlled by the electrical signal (or signals). Control of the amplitude, duration or both of the back-side vibration 610B may be by an analog electrical signal, a digital electrical signal, or both.

An under-side vibrator 600U is mounted to an underside of the collector 60, for example, on a side of the collector 60 between the right-side vibrator 600R, the left-side vibrator 600L, the front-side vibrator 600F and the back-side vibrator 600B. The under-side vibrator 600U may be a piezoelectric vibrator, eccentric rotating mass (ERM) vibrator, linear resonant actuator or other suitable vibrator. The under-side vibrator 600U may be controllable by an electrical signal. In some embodiments, amplitude of under-side vibration 610U, duration of under-side vibration 610U, or both are controlled by the electrical signal (or signals). Control of the amplitude, duration or both of the under-side vibration 610U may be by an analog electrical signal, a digital electrical signal, or both.

It should be understood that one or more of the vibrators 600 may be different from others of the vibrators 600. For example, the under-side vibrator 600U may be an ERM vibrator, and the right-, left-, front- and back-side vibrators 600R, 600L, 600F, 600B may be piezoelectric vibrators. In some embodiments, one or two of the right-, left-, front- and back-side vibrators 600R, 600L, 600F, 600B may be omitted. For example, instead of the right-, left-, front- and back-side vibrators 600R, 600L, 600F, 600B that may be equally spaced around the collector 60, three vibrators may be equally spaced around the collector 60. In some embodiments, the front- and left-side vibrators 600F, 600L may be omitted. In some embodiments, the under-side vibrator 600U may be omitted. Generally, in most embodiments, a number of vibrators 600 sufficient to generate vibrations 610 in three directions (e.g., the X-, Y- and Z-axis directions) is mounted to the collector 60. For example, as shown in FIG. 6B, the left- and right-side vibrators 600L, 600R may generate vibrations 610L, 610R that are oriented along two directions (e.g., the Y- and Z-axis directions). The vibrations 830 at or near the drop 83 are generated based on the vibrations 610.

Through control of the vibrators 600, the drop 83 may be broken up by the vibrations 830 at or near the drop 83. For example, the vibrations 830 may generate dragging force, pulling force, or both on the drop 83. In some embodiments, the vibrators 600 generate the vibrations 830 as a combination of primary waves (or "P-waves") and surface waves (or "S-waves"). The P-waves are parallel to the surface of the collector 60 on which the drop 83 is positioned, and may cause motion that is transverse the surface. The S-waves are perpendicular to the surface of the collector 60 on which the drop 83 is positioned, and may cause motion that is parallel the surface. The S-waves supply dragging and pulling force (e.g., shear force) on the drop 83, which is effective to break up the drop 83 into removable debris 83P. The vibrations 830 may include P-waves, S-waves or a combination thereof.

Figure 7A:
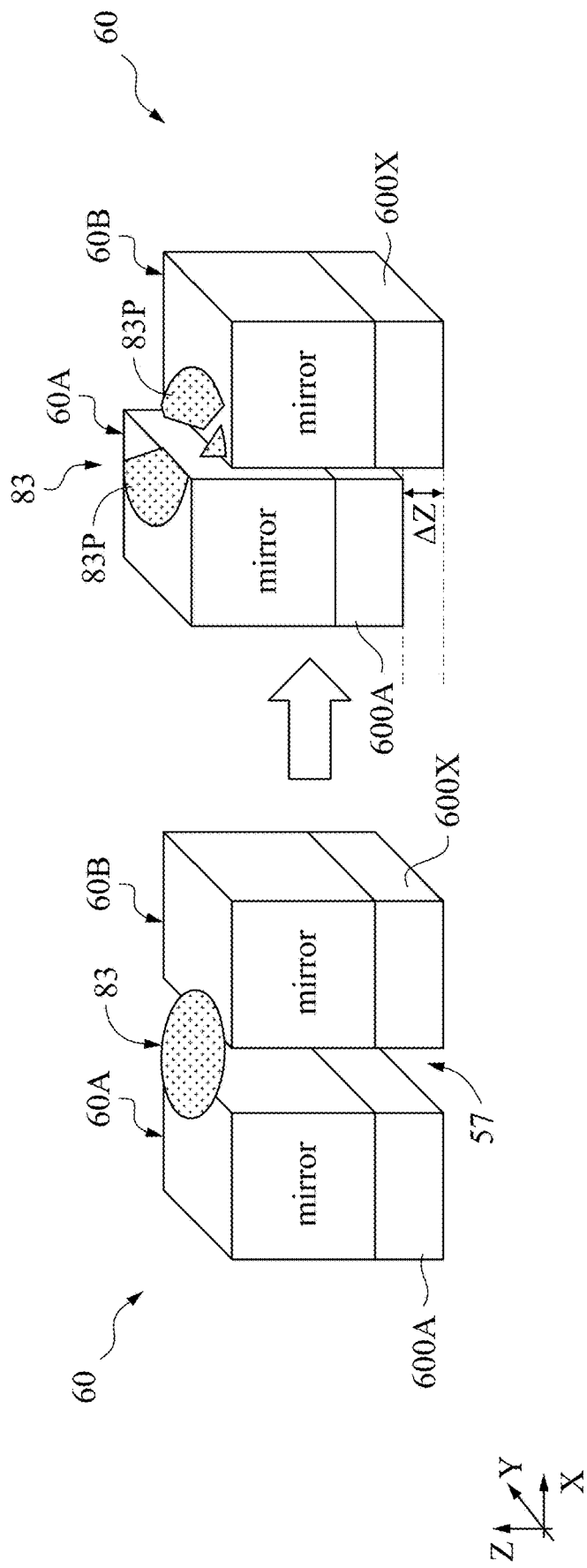
Figure 7C:
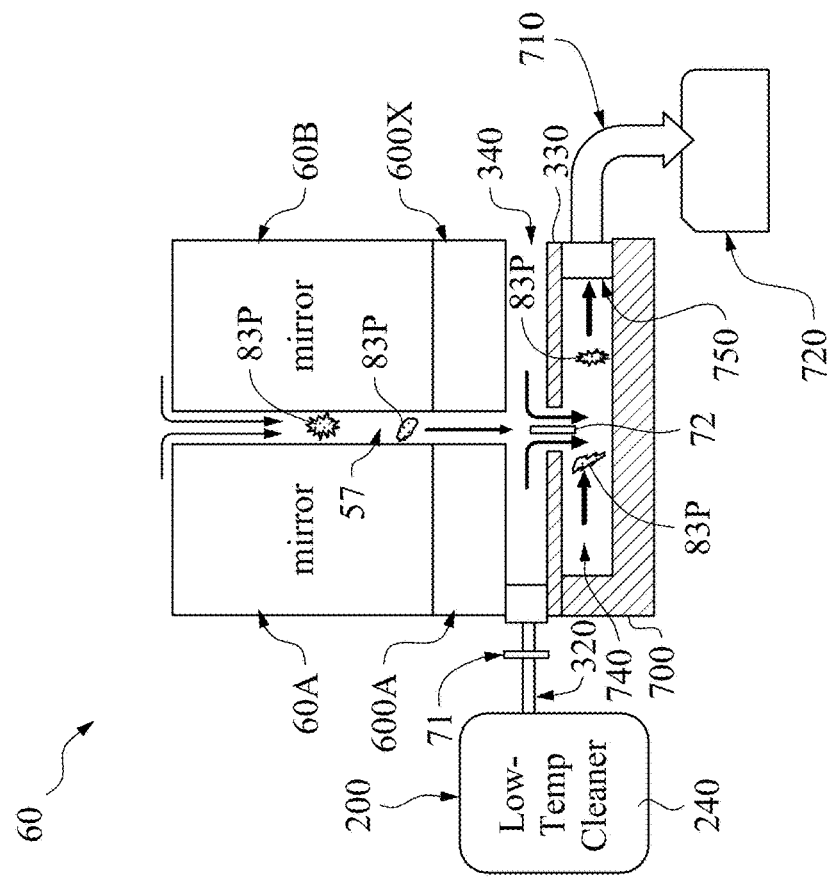
Figure 7B:
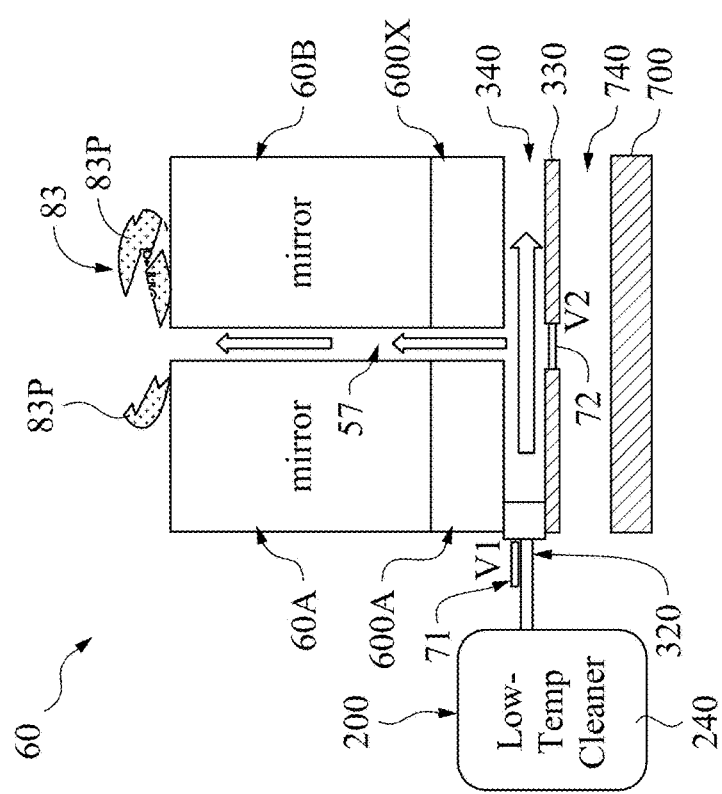

FIGS. 7A-7C are diagrams illustrating breaking the drop 83 in accordance with various embodiments. FIG. 7A is a diagram of use of vibrators 600A, 600X with the sectional collector 60 to break up the drop 83. FIGS. 7B and 7C are diagrams of breaking up the drop 83 on, and exhausting removable debris 83P from, the sectional collector 60.

In FIG. 7A, the sectional collector 60 includes the collector sections 60A, 60B, as described with reference to FIGS. 1C, 1D. The drop 83 is positioned over the gap 57 between the collector sections 60A, 60B. The drop 83 is on the reflecting surface of the collector sections 60A, 60B. The vibrator 600A is mounted to the collector section 60A. In some embodiments, the vibrator 600A is mounted to the backside of the collector section 60A, which is opposite the reflecting surface of the collector section 60A. The vibrator 600A may be a piezoelectric vibrator, eccentric rotating mass (ERM) vibrator, linear resonant actuator or other suitable vibrator. The vibrator 600A may be controllable by an electrical signal. In some embodiments, amplitude of vibration, duration of vibration, or both of the vibration generated by the vibrator 600A are controlled by the electrical signal (or signals). Control of the amplitude, duration or both of the vibration may be by an analog electrical signal, a digital electrical signal, or both. In some embodiments, two or more vibrators 600A are mounted to the collector section 60A, for example, as shown in FIGS. 6A and 6B.

The vibrator 600X is mounted to the collector section 60B. In some embodiments, the vibrator 600X is mounted to the backside of the collector section 60B, which is opposite the reflecting surface of the collector section 60B. The vibrator 600X may be a piezoelectric vibrator, eccentric rotating mass (ERM) vibrator, linear resonant actuator or other suitable vibrator. The vibrator 600X may be controllable by an electrical signal. In some embodiments, amplitude of vibration, duration of vibration, or both of the vibration generated by the vibrator 600X are controlled by the electrical signal (or signals). Control of the amplitude, duration or both of the vibration may be by an analog electrical signal, a digital electrical signal, or both. In some embodiments, two or more vibrators 600A are mounted to the collector section 60A, for example, as shown in FIGS. 6A and 6B.

To break up the drop 83, one or more of the vibrators 600A, 600X vibrates, such that the collector sections 60A, 60B are separated by a change in gap in the vertical direction, e.g., the Z-axis direction shown by separation AZ in FIG. 7A. The change in the gap between the collector sections 60A, 60B may be in a range of about 0.1 mm to about 10 mm. In some embodiments, prior to action of the vibrators 600A, 600X, the reflective surfaces of the collector sections 60A, 60B may be separated from each other by a resting gap in the Z-axis direction, as illustrated in FIG. 1D. As such, the change in the gap may be an increase or decrease from the resting gap as shown by the separation AZ. By changing the gap, stress may be applied to the drop 83, such that the drop 83 is broken into removable debris 83P, as shown on the right-hand side of FIG. 7A.

FIGS. 7B and 7C show breaking up the drop 83 on (FIG. 7B), and exhausting removable debris 83P from (FIG. 7C), the sectional collector 60. In some embodiments, the vibrators 600A, 600X may be utilized with the cleaner 240 to break up the drop 83, as shown in FIG. 7B. Following dispensing of the cleaner 240, breaking up of the drop 83, or both, the removable debris 83P is exhausted into a container 720, such as a waste bin, by an exhausting apparatus 750 as shown in FIG. 7C. To protect the exhausting apparatus 750 from the low-temperature cleaner 240, valves 71, 72 may be used to control flow of the cleaner 240 when the cleaner 240 is dispensed into the space 340 and the gap 57.

In FIG. 7B, the cleaner 240 is dispensed into the space 340 and the gap 57 as described with reference to FIG. 3. As shown in FIG. 7B, cleaner valve 71 maybe open during dispensing of the cleaner 240, and exhaust valve 72 may be closed during dispensing of the cleaner 240. Due to chilling by the cleaner 240, the drop 83 changes from first phase debris to second phase debris partially or fully. Simultaneous with and/or following the changing of phase in the drop 83, one or more of the vibrators 600A, 600X generates vibration. The drop 83 breaks up due to the change in phase, the vibration, or both. For example, the cleaner 240 may be dispensed and the vibrators 600A, 600X may be inactive in a first period. Following the first period, the cleaner 240 may be not dispensed (e.g., cleaner valve 71 is closed) and the vibrators 600A, 600X may vibrate in a second period. Exhausting of the removable debris 83P may be performed in the second period (e.g., simultaneous with vibration of the vibrators 600A, 600X) or in a third period following the second period, in which the vibrators 600A, 600X are inactive.

In FIG. 7C, after breaking up the drop 83, a large amount of removable debris 83P may be formed. The exhausting apparatus 750 provides removal of the removable debris 83P, and may operate similar to a vacuum machine. The removable debris 83P is exhausted into the container 720, for example, by the exhausting apparatus 750, which may be a vacuum in some embodiments. With the exhausting valve 72 open, the exhausting apparatus 750 may generate air flow (illustrated by arrows 710 in FIG. 7C) that draws the removable debris 83P into and through the gap 57, into the space 340, through the exhaust valve 72, into space 740, through the exhausting apparatus 750, and into the container 720. The space 740 may be present between the housing 330 and a secondary housing 700, for example, of the lithography exposure system 10. During exhausting of the removable debris 83P, the exhausting apparatus 750 is active to generate the air flow, the exhaust valve 72 is open, and the cleaner valve 71 is closed.

Figure 8B:
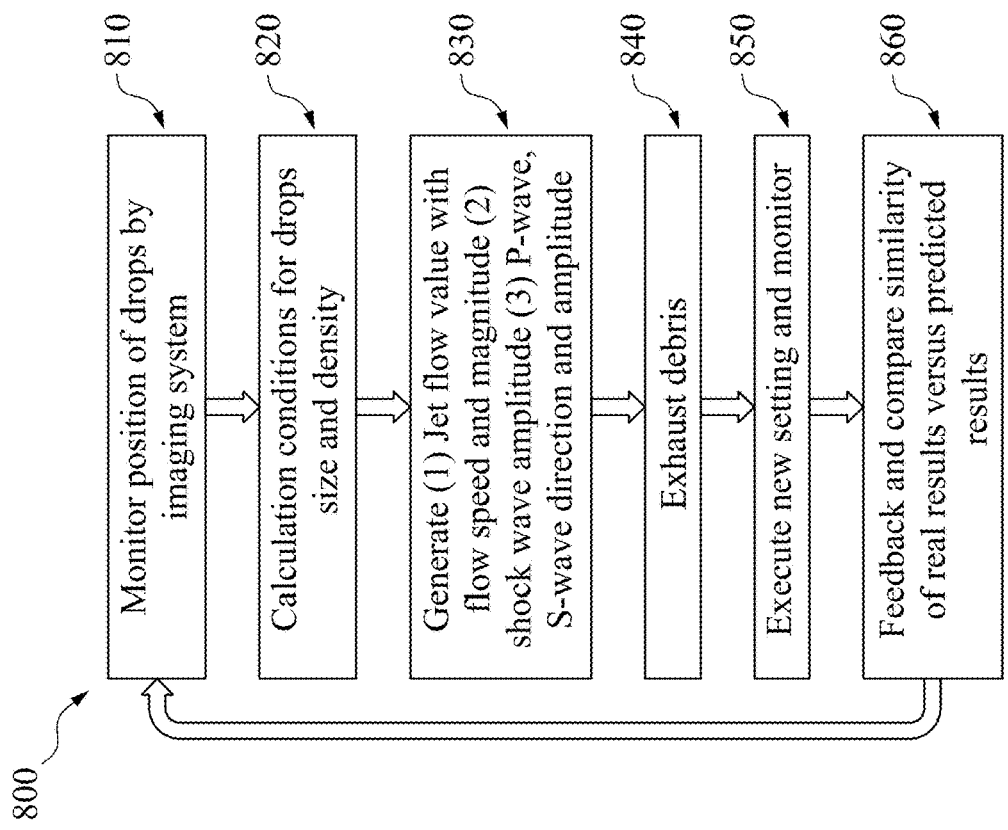
FIGS. 8A-8D are views illustrating a method of cleaning a mirror in accordance with various embodiments.
Figure 8A:
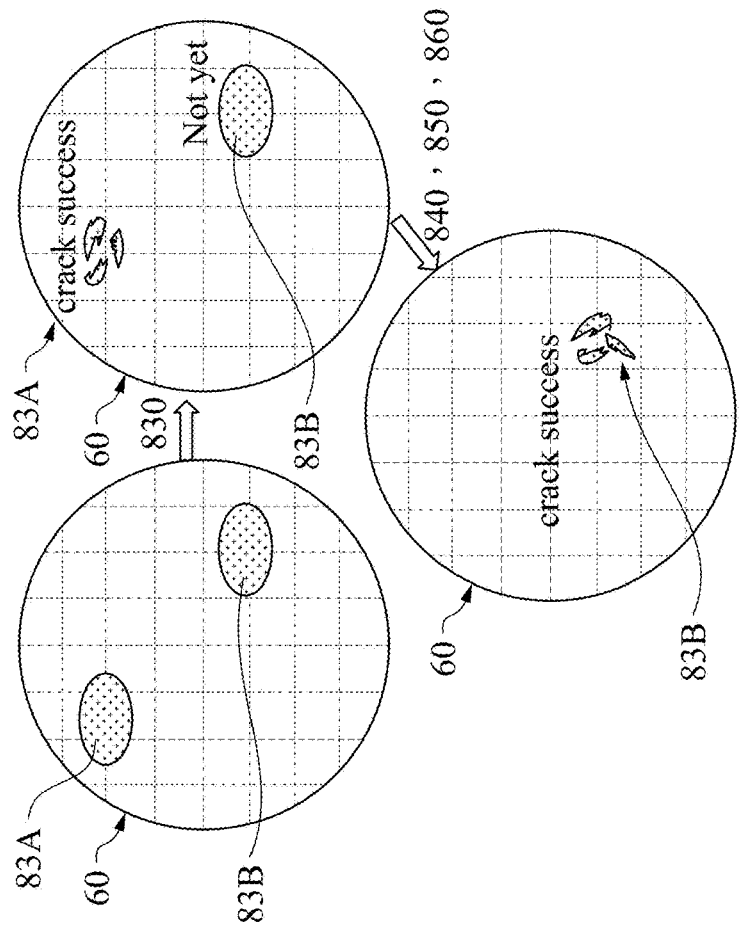
Figure 8C:
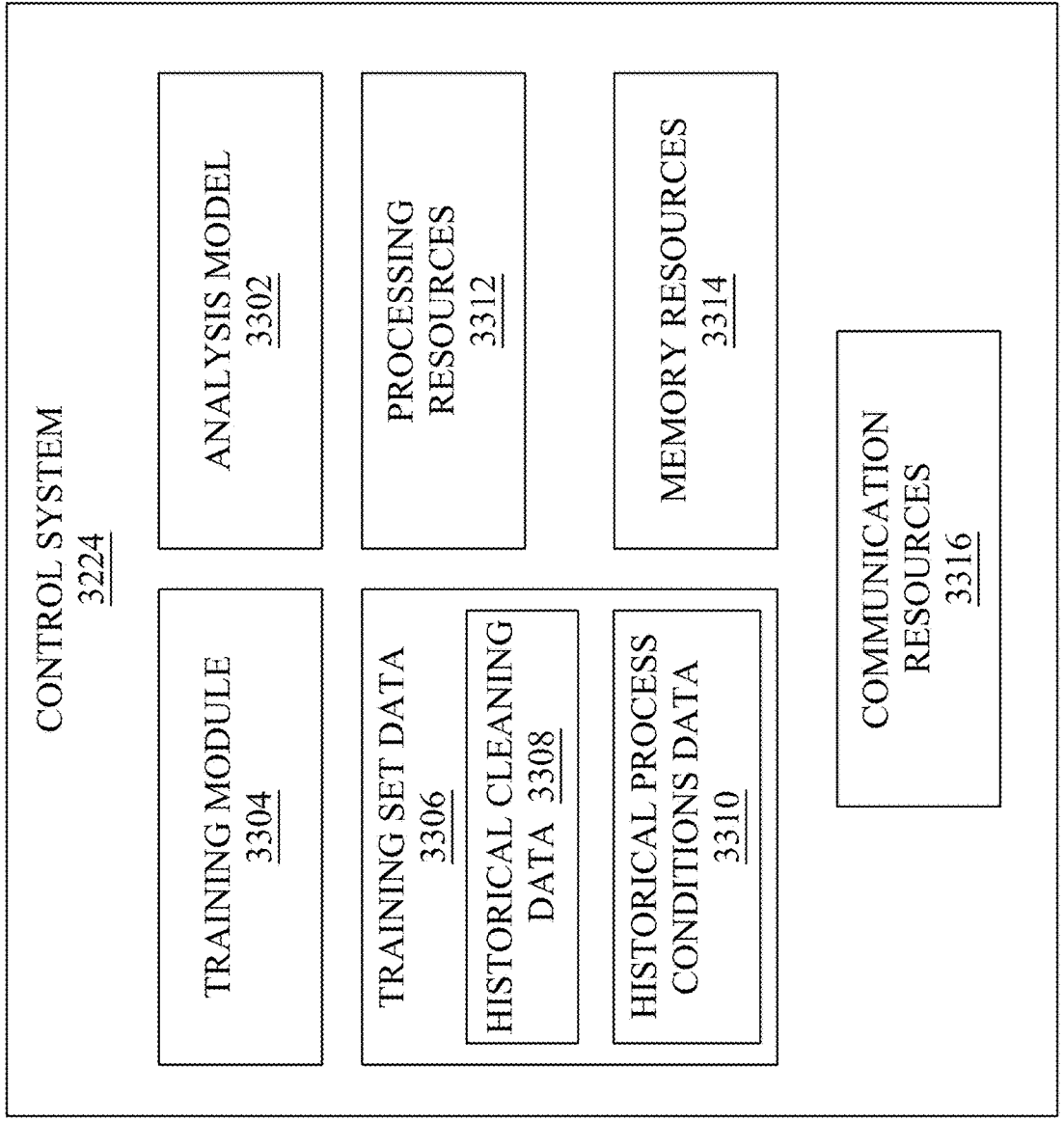
Figure 8D:
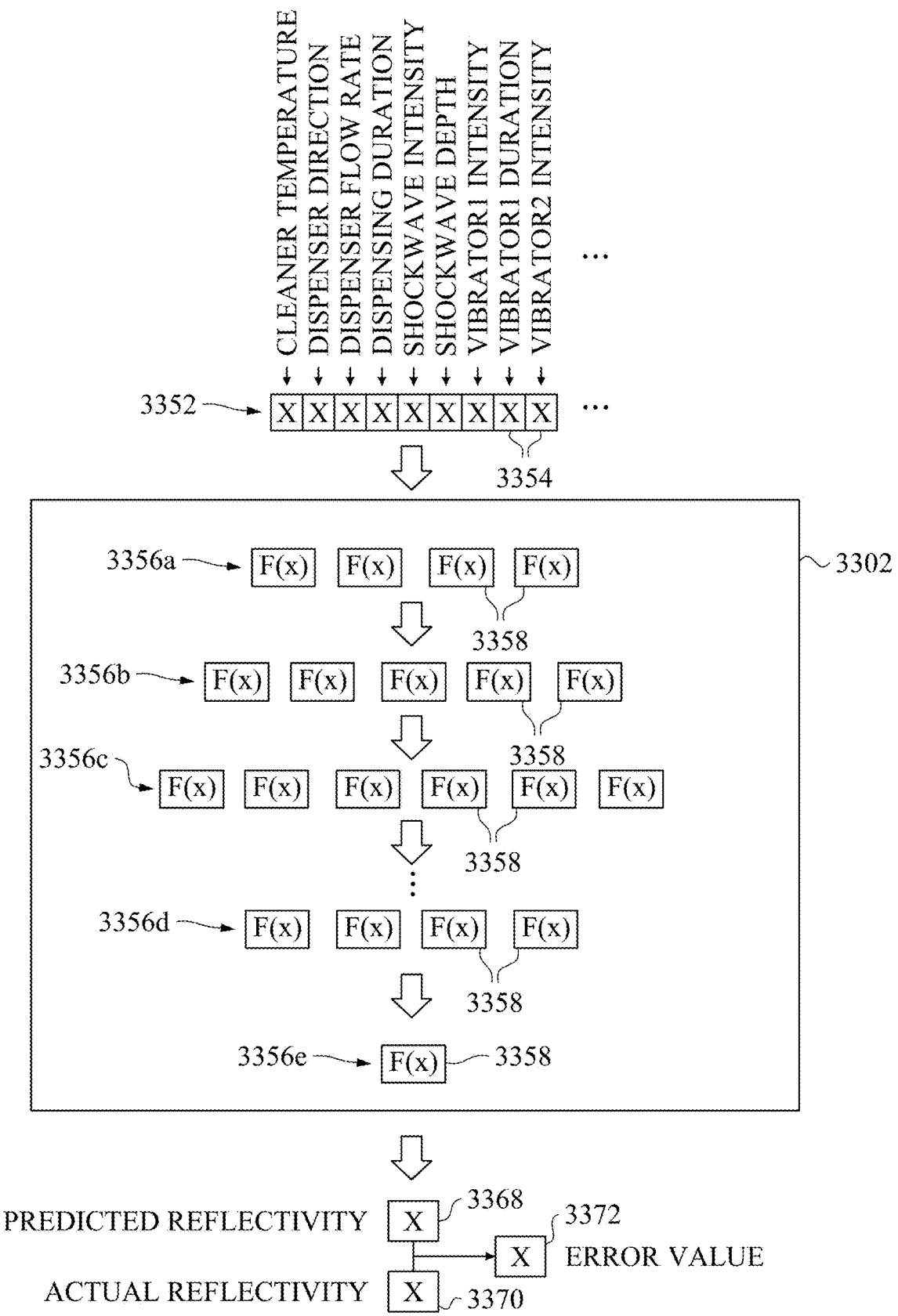

FIGS. 8A-8D are views illustrating a method of cleaning a mirror in accordance with various embodiments. FIG. 8A is a view of the collector 60 and drops 83A, 83B at various phases of performing the method. FIG. 8B is a flowchart of the method in accordance with various embodiments. FIG. 8C is a diagram of a control system 3224 for implementing one or more operations of the method shown in FIG. 8B. FIG. 8D is a block diagram illustrating operational aspects and training aspects of the analysis model 3302 of FIG. 8C, according to various embodiments.

In FIG. 8B, a process 800 includes operations 810-860. It should be noted that the operations 810-860 of the process 800 may be rearranged or otherwise modified within the scope of the various aspects. It should further be noted that additional processes may be provided before, during, and after the process 800, and that some other processes may be only briefly described herein. In some embodiments, the process 800 is performed by the lithography exposure system 10 described in FIGS. 1A-1D.

In operation 810, positions of drops 83A, 83B are monitored (e.g., imaged) by an imaging system. In some embodiments, the imaging system includes a camera, such as a charge-coupled device (CCD) camera, a complementary MOS (CMOS) camera, or other suitable camera. The camera may capture one or more images of the collector 60 and the drops 83A, 83B. Based on the images, the imaging system may determine positions of the drops 83A, 83B. For example, the imaging system may use edge detection to identify pixels associated with the drops 83A, 83B as a two-dimensional shape of the drops 83A, 83B. A center of the two-dimensional shape, for example, of the drop 83A may be determined. The center may be a center of mass, or other suitable center. Coordinates may be associated with the respective centers of the drops 83A, 83B.

In operation 820, conditions of the drops 83A, 83B, such as size and density, may be determined. Taking the drop 83A as an example, the size of the drop 83A may be determined based on area of the two-dimensional shape of the drop 83A determined in operation 810. In some embodiments, the size of the drop 83A includes a third dimension (e.g., height), such that the size is calculated as a volume of the drop 83A. Calculation of the volume of the drop 83A may include estimation of the volume based on a luminosity gradient of the pixels associated with the drop 83A.

In operation 830, one or more process parameters are generated. The one or more process parameters may include a jet flow value (e.g., of the dispenser 210), which may include flow speed and magnitude, and may include flow duration, flow direction, or both. The one or more process parameters may include a shock wave amplitude and duration, for example, of the shockwave generator of the cleaning system 500. The one or more process parameters may include direction, amplitude and duration of P-waves and S-waves generated by the vibrators 600. For example, respective vibration intensities and durations of the vibrators 600L, 600R, 600F, 600B, 600U, 600X may be generated in operation 830. The operation 830 is described in greater detail with reference to FIGS. 8C and 8D. The operation 830 may be performed by a control system 3224 shown in FIG. 8C. In the operation 830, cleaning of the drops 83A, 83B may be performed in accordance with the one or more process parameters generated. For example, the dispenser 210 may dispense the cleaner 240 at the flow speed and magnitude for the flow duration.

In operation 840, debris is exhausted. For example, as shown in FIG. 8A, following operation 830, the drop 83A is cracked, and the drop 83B is not cracked. The debris (e.g., pieces of the cracked drop 83A) may be exhausted, for example, by the exhausting apparatus 750 of FIG. 7C. The debris may be exhausted by air flow across the collector 60, vacuuming, or both.

In operation 850, after exhausting the debris, the one or more process parameters are generated again (e.g., new settings are generated), and the cleaning of the drop 83B is performed (e.g., executed using the new settings). Results of the cleaning performed in operation 850 are monitored, for example, by capturing an image of the collector 60. The monitoring may also include analyzing the image captured. The analyzing may include performing one or more image processing algorithms on the image, such as an edge detection or the like, for identifying location and size of the drops 83A, 83B.

In operation 860, real results of the cleaning are compared with predicted results of the cleaning, and the real and predicted results are fed back to a control system (e.g., the control system 3224) that is used to generate the one or more process parameters. The comparing may including generating an error value (e.g., an error value 3372 shown in FIG. 8D). The error value may be used in operation 830 when generating the one or more process parameters. The process 800 may be a loop, such that operation 810 is performed following operation 830. By feeding back the results in operation 860, the process 800 may improve over many passes through the operations 810-860, for example, by generating the one or more parameters with greater accuracy to remove drops on the collector 60 more effectively.

FIG. 8C is a block diagram of a control system 3224, according to one embodiment. The control system 3224 of FIG. 8C is configured to control operation of the system 10 in performing deposition, etching or other processes to form nanostructure devices, according to one embodiment. The control system 3224 may perform one or more of the operations 810-860 of the process 800. The control system 3224 utilizes machine learning to adjust parameters of the system 10. The control system 3224 can adjust parameters of the system 10 between cleaning runs, for example, based on results of a cleaning process (e.g., the process 800). In some embodiments, the control system 3224 adjusts parameters of the system 10 between wafer processing operations, for example, based on results of a thin film deposition or etching process. For example, the control system 3224 may adjust parameters of the system 10 between deposition runs, etching runs, or both, or between deposition cycles, etching cycles or both in order to ensure that a thin-film layer formed by the deposition or etching process falls within selected specifications. The deposition may be atomic layer deposition (ALD), and the etching may be atomic layer etching (ALE). The cleaning process may be performed intermittently between wafer processing operations. In some embodiments, the results of the thin film deposition or etching process may be used to adjust the parameters of the cleaning process.

In one embodiment, the control system 3224 includes an analysis model 3302 and a training module 3304. The training module 3304 trains the analysis model 3302 with a machine learning process. The machine learning process trains the analysis model 3302 to select parameters for the cleaning process that will result in a collector having selected characteristics. Although the training module 3304 is shown as being separate from the analysis model 3302, in practice, the training module 3304 may be part of the analysis model 3302.

The control system 3224 includes, or stores, training set data 3306. The training set data 3306 includes historical cleaning data 3308 and historical process conditions data 3310. The historical cleaning data 3308 includes data related to collectors resulting from cleaning processes. The historical process conditions data 3310 includes data related to process conditions during the cleaning processes that generated the collector data, e.g., collector surface images. As will be set forth in more detail below, the training module 3304 utilizes the historical cleaning data 3308 and the historical process conditions data 3310 to train the analysis model 3302 with a machine learning process.

In one embodiment, the historical cleaning data 3308 includes data related to reflectivity of the collector. For example, during operation of a semiconductor fabrication facility, hundreds or thousands of collectors may be cleaned over the course of several months or years. Each of the collectors may include a surface cleaned by the cleaning process. After each cleaning process, the data of the collectors (e.g., reflectivity) are measured as part of a quality control process. The historical cleaning data 3308 includes the data of each collector cleaned by cleaning processes. Accordingly, the historical cleaning data 3308 can include reflectivity data for a large number of collectors cleaned by cleaning processes.

In one embodiment, the historical cleaning data 3308 may also include data related to the reflectivity of the collector at intermediate stages of the cleaning processes. For example, a cleaning process may include a large number of cleaning cycles during which small numbers of drops are removed. The historical cleaning data 3308 can include reflectivity data for collectors after individual cleaning cycles or groups of cleaning cycles. Thus, the historical cleaning data 3308 not only includes data related to the reflectivity of a collector after completion of a cleaning process, but may also include data related to the reflectivity of the collector at various stages of the cleaning process.

In one embodiment, the historical cleaning data 3308 includes data related to the power output of the collectors cleaned by cleaning processes. After a thin film is deposited or etched, measurements can be made to determine the patterning of the thin films. Successful patterning of the thin films results in a thin film that includes particular dimensions (e.g., pitch, spacing, or the like). Unsuccessful etching processes may result in a thin film that does not include the selected dimensions of formed structures. The historical cleaning data 3308 can include data from measurements indicating the dimensions of structures that are formed from the various thin films.

In one embodiment, the historical process conditions 3310 include various process conditions or parameters during cleaning processes that clean the collectors associated with the historical cleaning data 3308. Accordingly, for each collector having data in the historical cleaning data 3308, the historical process conditions data 3310 can include the process conditions or parameters that were present during cleaning of the collector. For example, the historical process conditions data 3310 can include data related to the cleaner temperature, dispenser flow rate, shockwave intensity, or vibrator duration during cleaning processes.

The historical process conditions data 3310 can include data related to temperature of the cleaner during cleaning processes. The historical process conditions data 3310 can include data related to the age of the collector, the number of cleaning processes that have been performed on the collector, a number of deposition or etching processes that have been performed using the collector since the most recent cleaning cycle of the collector, or other data related to the collector. The historical process conditions data 3310 can include data related to shockwaves or vibrations applied to the collector during the cleaning process. The data related to the shockwaves or vibrations can include shockwave intensities, shockwave depths, vibrator intensities and vibrator durations applied to the collector. The historical process conditions data 3310 can include data related to environmental conditions (e.g., humidity) within the system 10 during cleaning processes. The historical process conditions data 3310 can include data related to the length of pipes, tubes, or conduits that carry cleaner to the collector during cleaning processes.

In one embodiment, historical process conditions data 3310 can include process conditions for each of a plurality of individual cycles of a single cleaning process. Accordingly, the historical process conditions data 3310 can include process conditions data for a very large number of cleaning cycles.

In one embodiment, the training set data 3306 links the historical cleaning data 3308 with the historical process conditions data 3310. In other words, the reflectivity or number of drops associated with a collector in the historical cleaning data 3308 is linked (e.g., by labeling) to the process conditions data associated with that cleaning process. As will be set forth in more detail below, the labeled training set data can be utilized in a machine learning process to train the analysis model 3302 to predict cleaning process conditions that will result in properly cleaned collectors.

In one embodiment, the control system 3224 includes processing resources 3312, memory resources 3314, and communication resources 3316. The processing resources 3312 can include one or more controllers or processors. The processing resources 3312 are configured to execute software instructions, process data, make thin-film etching control decisions, perform signal processing, read data from memory, write data to memory, and to perform other processing operations. The processing resources 3312 can include physical processing resources 3312 located at a site or facility of the system 10. The processing resources can include virtual processing resources 3312 remote from the site of the system 10 or a facility at which the system 10 is located. The processing resources 3312 can include cloud-based processing resources including processors and servers accessed via one or more cloud computing platforms.

In one embodiment, the memory resources 3314 can include one or more computer readable memories. The memory resources 3314 are configured to store software instructions associated with the function of the control system and its components, including, but not limited to, the analysis model 3302. The memory resources 3314 can store data associated with the function of the control system 3224 and its components. The data can include the training set data 3306, current process conditions data, and any other data associated with the operation of the control system 3224 or any of its components. The memory resources 3314 can include physical memory resources located at the site or facility of the system 10. The memory resources can include virtual memory resources located remotely from site or facility of the system 10. The memory resources 3314 can include cloud-based memory resources accessed via one or more cloud computing platforms.

In one embodiment, the communication resources can include resources that enable the control system 3224 to communicate with equipment associated with the system 10. For example, the communication resources 3316 can include wired and wireless communication resources that enable the control system 3224 to receive the sensor data associated with the system 10 and to control equipment of the system 10. The communication resources 3316 can enable the control system 3224 to control the flow of cleaner, the depth of shockwaves or the intensity of vibrators. The communication resources 3316 can enable the control system 3224 to control heaters, voltage sources, valves, exhaust channels, wafer transfer equipment, and any other equipment associated with the system 10. The communication resources 3316 can enable the control system 3224 to communicate with remote systems. The communication resources 3316 can include, or can facilitate communication via, one or more networks such as wire networks, wireless networks, the Internet, or an intranet. The communication resources 3316 can enable components of the control system 3224 to communicate with each other.

In one embodiment, the analysis model 3302 is implemented via the processing resources 3312, the memory resources 3314, and the communication resources 3316. The control system 3224 can be a dispersed control system with components and resources and locations remote from each other and from the system 10.

FIG. 8D is a block diagram illustrating operational aspects and training aspects of the analysis model 3302 of FIG. 8C, according to one embodiment. The analysis model 3302 can be used to select parameters for cleaning processes performed by the system 10 of FIG. 1A to clean the collector 60 of FIGS. 1A-1F. As described previously, the training set data 3306 includes data related to a plurality of previously performed collector cleaning processes. Each previously performed collector cleaning process took place with particular process conditions and resulted in a collector having a particular characteristics. The process conditions for each previously performed collector cleaning process are formatted into a respective process conditions vector 3352. The process conditions vector includes a plurality of data fields 3354. Each data field 3354 corresponds to a particular process condition.

The example of FIG. 8D illustrates a single process conditions vector 3352 that will be passed to the analysis model 3302 during the training process. In the example of FIG. 8D, the process conditions vector 3352 includes nine or more data fields 3354. A first data field 3354 corresponds to the temperature of the cleaner during the previously performed collector cleaning process. A second data field 3356 corresponds to the dispenser direction during the previously performed collector cleaning process. A third data field 3354 corresponds to the dispenser flow rate during the previously performed collector cleaning process. The fourth data field 3354 corresponds to the dispensing duration of cleaner during the previously performed collector cleaning process. The fifth data field 3354 corresponds to the intensity of shockwaves during the previously performed collector cleaning process. The sixth data field 3354 corresponds to the depth of shockwaves used in the previously performed collector cleaning process. The seventh data field 3354 corresponds to intensity of vibration of a first vibrator during the previously performed collector cleaning process. The eighth data field 3354 corresponds to duration of vibration of the first vibrator utilized during the previously performed collector cleaning process. The ninth data field corresponds to the intensity of vibration of a second vibrator during the previously performed collector cleaning process. In practice, each process conditions vector 3352 can include more or fewer data fields than are shown in FIG. 8D without departing from the scope of the present disclosure. For example, the process conditions vector 3352 may not include data fields 3354 associated with shockwave generation, vibration generator, or both, if the shockwave generator or vibrators are not used in the cleaning process. Each process conditions vector 3352 can include different types of process conditions without departing from the scope of the present disclosure. The particular process conditions illustrated in FIG. 8D are given only by way of example. Each process condition is represented by a numerical value in the corresponding data field 3354. For condition types that are not naturally represented in numbers, a number can be assigned to each possible phase.

The analysis model 3302 includes a plurality of neural layers 3356a-e. Each neural layer includes a plurality of nodes 3358. Each node 3358 can also be called a neuron. Each node 3358 from the first neural layer 3356a receives the data values for each data field from the process conditions vector 3352. Accordingly, in the example of FIG. 8D, each node 3358 from the first neural layer 3356a receives nine data values because the process conditions vector 3352 has nine data fields. Each neuron 3358 includes a respective internal mathematical function labeled F(x) in FIG. 8D. Each node 3358 of the first neural layer 3356a generates a scalar value by applying the internal mathematical function F(x) to the data values from the data fields 3354 of the process conditions vector 3352. Further details regarding the internal mathematical functions F(x) are provided below.

Each node 3358 of the second neural layer 3356b receives the scalar values generated by each node 3358 of the first neural layer 3356a. Accordingly, in the example of FIG. 8D each node of the second neural layer 3356b receives four scalar values because there are four nodes 3358 in the first neural layer 3356a. Each node 3358 of the second neural layer 3356b generates a scalar value by applying the respective internal mathematical function F(x) to the scalar values from the first neural layer 3356a.

Each node 3358 of the third neural layer 3356c receives the scalar values generated by each node 3358 of the second neural layer 3356b. Accordingly, in the example of FIG. 8D each node of the third neural layer 3356c receives five scalar values because there are five nodes 3358 in the second neural layer 3356b. Each node 3358 of the third neural layer 3356c generates a scalar value by applying the respective internal mathematical function F(x) to the scalar values from the nodes 3358 of the second neural layer 3356b.

Each node 3358 of the neural layer 3356d receives the scalar values generated by each node 3358 of the previous neural layer (not shown). Each node 3358 of the neural layer 3356d generates a scalar value by applying the respective internal mathematical function F(x) to the scalar values from the nodes 3358 of the second neural layer 3356b.

The final neural layer includes only a single node 3358. The final neural layer receives the scalar values generated by each node 3358 of the previous neural layer 3356d. The node 3358 of the final neural layer 3356e generates a data value 3368 by applying a mathematical function F(x) to the scalar values received from the nodes 3358 of the neural layer 3356d.

In the example of FIG. 8D, the data value 3368 corresponds to the predicted reflectivity of a collector generated by process conditions data corresponding to values included in the process conditions vector 3352. In other embodiments, the final neural layer 3356e may generate multiple data values each corresponding to a particular collector characteristic such as collector reflectivity, collector number of drops, or other characteristics of the collector. The final neural layer 3356e will include a respective node 3358 for each output data value to be generated. In the case of a predicted collector reflectivity, engineers can provide constraints that specify that the predicted collector reflectivity 3368 must fall within a selected range, such as between 90% and 100%, in one example. The analysis model 3302 will adjust internal functions F(x) to ensure that the data value 3368 corresponding to the predicted collector reflectivity will fall within the specified range.

During the machine learning process, the analysis model compares the predicted collector reflectivity in the data value 3368 to the actual collector reflectivity of the collector as indicated by the data value 3370. As set forth previously, the training set data 3306 includes, for each set of historical process conditions data, collector characteristics data indicating the characteristics of the collector that resulted from the historical collector cleaning process. Accordingly, the data field 3370 includes the actual collector reflectivity of the collector that resulted from the etching process reflected in the process conditions vector 3352. The analysis model 3302 compares the predicted collector reflectivity from the data value 3368 to the actual collector reflectivity from the data value 3370. The analysis model 3302 generates an error value 3372 indicating the error or difference between the predicted collector reflectivity from the data value 3368 and the actual collector reflectivity from the data value 3370. The error value 3372 is utilized to train the analysis model 3302.

The training of the analysis model 3302 can be more fully understood by discussing the internal mathematical functions F(x). While all of the nodes 3358 are labeled with an internal mathematical function F(x), the mathematical function F(x) of each node is unique. In one example, each internal mathematical function has the following form:

$$F(x) = x1*w1 + x2*w2 + \ldots xn*w1 + b.$$

In the equation above, each value x1-xn corresponds to a data value received from a node 3358 in the previous neural layer, or, in the case of the first neural layer 3356a, each value x1-xn corresponds to a respective data value from the data fields 3354 of the process conditions vector 3352. Accordingly, n for a given node is equal to the number of nodes in the previous neural layer. The values w1-wn are scalar weighting values associated with a corresponding node from the previous layer. The analysis model 3302 selects the values of the weighting values w1-wn. The constant b is a scalar biasing value and may also be multiplied by a weighting value. The value generated by a node 3358 is based on the weighting values w1-wn. Accordingly, each node 3358 has n weighting values w1-wn. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 3372 has been calculated, the analysis model 3302 adjusts the weighting values w1-wn for the various nodes 3358 of the various neural layers 3356a-3356e. After the analysis model 3302 adjusts the weighting values w1-wn, the analysis model 3302 again provides the process conditions vector 3352 to the input neural layer 3356a. Because the weighting values are different for the various nodes 3358 of the analysis model 3302, the predicted collector reflectivity 3368 will be different than in the previous iteration. The analysis model 3302 again generates an error value 3372 by comparing the actual collector reflectivity 3370 to the predicted collector reflectivity 3368.

The analysis model 3302 again adjusts the weighting values w1-wn associated with the various nodes 3358. The analysis model 3302 again processes the process conditions vector 3352 and generates a predicted collector reflectivity 3368 and associated error value 3372. The training process includes adjusting the weighting values w1-wn in iterations until the error value 3372 is minimized or reduced to an acceptable level.

FIG. 8D illustrates a single process conditions vector 3352 being passed to the analysis model 3302. In practice, the training process includes passing a large number of process conditions vectors 3352 through the analysis model 3302, generating a predicted collector reflectivity 3368 for each process conditions vector 3352, and generating associated error value 3372 for each predicted collector reflectivity. The training process can also include generating an aggregated error value indicating the average error for all the predicted collector reflectivities for a batch of process conditions vectors 3352. The analysis model 3302 adjusts the weighting values w1-wn after processing each batch of process conditions vectors 3352. The training process continues until the average error across all process conditions vectors 3352 is less than a selected threshold tolerance. When the average error is less than the selected threshold tolerance, the analysis model 3302 training is complete and the analysis model is trained to accurately predict the reflectivity of collectors based on the process conditions. The analysis model 3302 can then be used to predict collector reflectivities and to select process conditions that will result in a desired collector reflectivity. During use of the trained model 3302, a process conditions vector, representing current process conditions for a current collector cleaning process to be performed, and having the same format at the process conditions vector 3352, is provided to the trained analysis model 3302. The trained analysis model 3302 can then predict the reflectivity of a collector that will result from those process conditions.

A particular example of a neural network based analysis model 3302 has been described in relation to FIG. 8D. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 9:
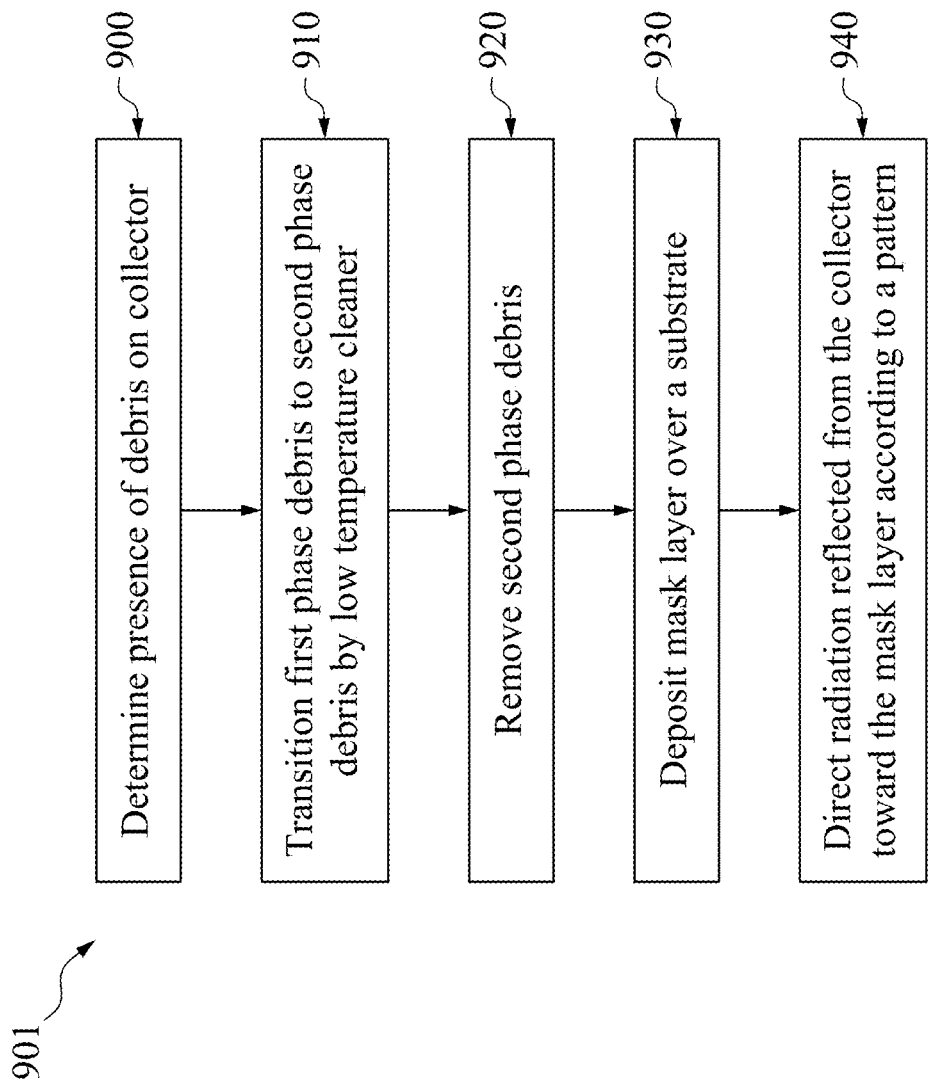
FIGS. 9 and 10 are views illustrating methods of cleaning a mirror according to various embodiments of the present disclosure.
Figure 10:
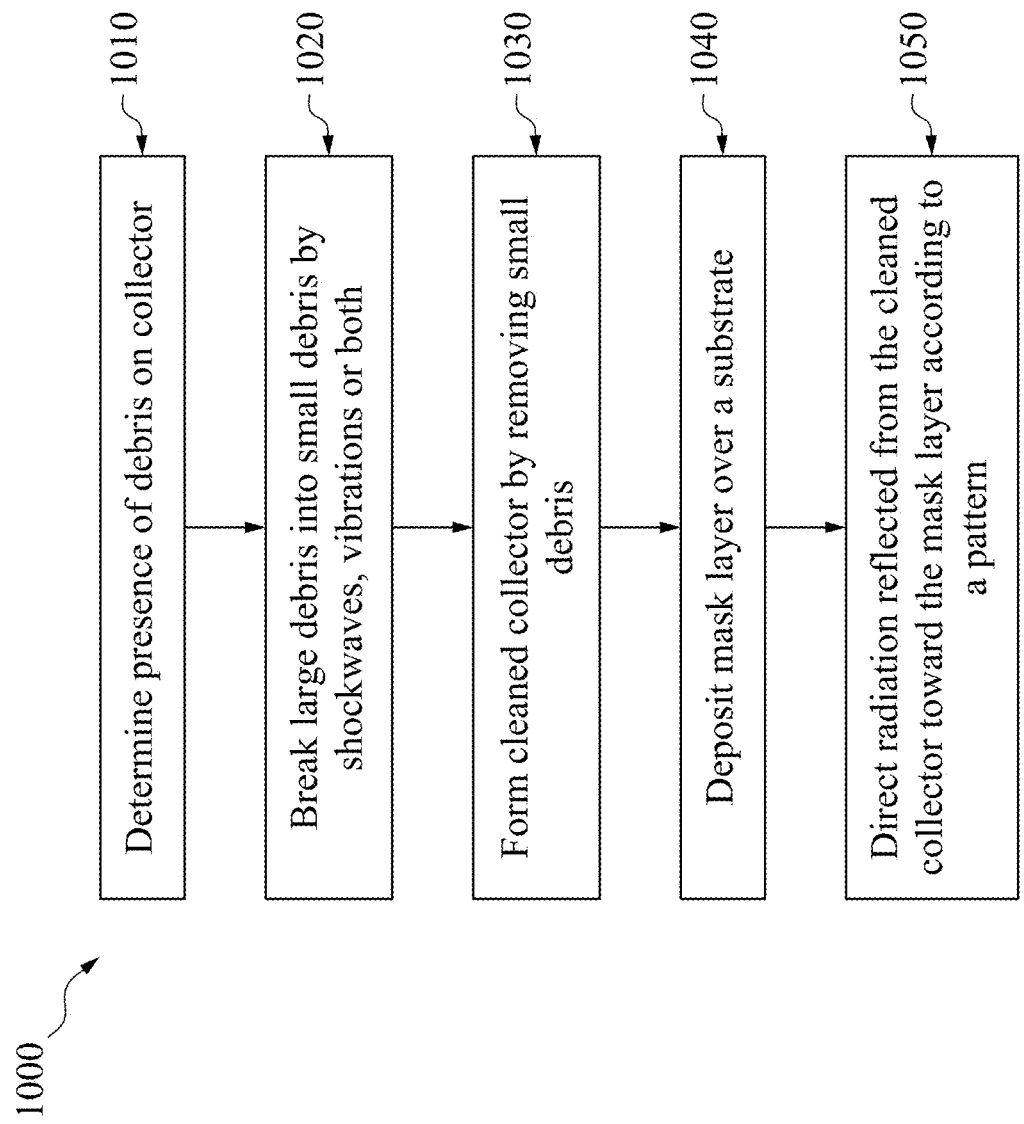

FIGS. 9 and 10 are views illustrating methods of cleaning a collector according to various embodiments of the present disclosure. FIG. 9 is a flowchart of a process 901 for cleaning a collector in accordance with various embodiments. In some embodiments, the process 901 for forming the device includes a number of operations (900, 910, 920, 930 and 940). The process 901 for forming the device will be further described according to one or more embodiments. It should be noted that the operations of the process 901 may be rearranged or otherwise modified within the scope of the various aspects. It should further be noted that additional processes may be provided before, during, and after the process 901, and that some other processes may be only briefly described herein. In some embodiments, the process 901 is performed by the lithography exposure system 10 described in FIGS. 1A-8D.

In operation 900, presence of debris on a collector is determined. For example, the drop 83 or drops 83A, 83B may be determined to be present on the collector 60. In operation 900, respective positions and sizes (e.g., width, length, radius, height, or the like) of the drops 83, 83A, 83B may be determined. The determining may include capturing a digital image (e.g., a digital photograph or video still) of a surface of the collector 60 on which the drops 83, 83A, 83B are positioned. The determining may include analyzing the digital image. The analyzing may include, for example, performing edge detection to determine perimeters of the drops 83, 83A, 83B, and performing center calculation to determine centers of the drops 83, 83A, 83B. The centers may be centers of mass, e.g., in two dimensions, in some embodiments.

In some embodiments, the determining is performed based on one or more threshold conditions. The threshold conditions may include a cleanliness condition based on a selected level of contamination, such as tin debris buildup, on the collector section or segment. In some embodiments, the cleanliness condition is a contamination condition. In some embodiments, the contamination condition includes a percentage contamination condition, such as surface area of the mirror-surface of the first collector segment including contamination greater than about 1%, greater than about 5%, or another suitable percentage condition. In some embodiments, the contamination condition includes a reflectivity condition, such as reflectivity of the first collector segment being less than about 95% of original reflectivity (e.g., ideal or theoretical reflectivity), less than about 90% of the original reflectivity, or another suitable reflectivity condition. In some embodiments, the original reflectivity is reflectivity of the first collector segment immediately preceding or following installation into the sectional collector 60.

In some embodiments, the threshold condition may include a scheduling threshold. For example, the scheduling threshold may include a period of time since installation or previous cleaning of the collector section or segment, such as greater than about 14 days, greater than about one month, or another suitable period of time. The scheduling threshold may include total runtime of the system 10 since installation of the collector section or segment, such as greater than about 12 days, greater than about 3 weeks, or another suitable total runtime. The scheduling threshold may include a number of wafers processed by the system 10 since installation of the collector section or segment, such as greater than about 10,000 wafers, greater than about 100,000 wafers, or another suitable number of wafers.

In operation 910, one or more of the drops 83, 83A, 83B is transitioned partially or fully from first phase debris to second phase debris by the cleaner 240, which is at a low temperature, as described with reference to FIG. 2, for example. The transitioning may be a result of directing the cleaner 240 toward the drops 83, 83A, 83B by the dispenser 210 at a selected flow rate in a selected direction for a selected duration. In some embodiments, the entire drop is transitioned, or one or more surface regions of the drop is transitioned. The transitioning results in the drop 83, 83A, 83B cracking, resulting in formation of removable debris, such as the removable debris 83P shown in FIGS. 6A-7C.

In operation 920, the second phase debris is removed. In some embodiments, the second phase debris is the removable debris 83P. The second phase debris may be removed by one or more operations, such as providing an air flow directed at the removable debris, exhausting the removable debris, or both.

In operation 930, a mask layer is deposited over a substrate. In some embodiments, the mask layer includes a photoresist layer that is sensitive to the EUV radiation 84. In some embodiments, the substrate is a semiconductor substrate, such as the semiconductor wafer 22 (see FIG. 1A). In some embodiments, the substrate is a layer overlying the semiconductor substrate, such as a dielectric layer, a metal layer, a hard mask layer, or other suitable layer. In some embodiments, the mask layer is deposited by spin coating or other suitable process.

In operation 940, radiation is directed from the collector toward the mask layer according to a pattern. The radiation may include first radiation that is reflected from a central collector section (e.g., the collector section 60A), and second radiation that is reflected from a first peripheral collector section (e.g., the collector section 60B). The radiation is reflected along an optical path between the collector 60 and the mask layer, which may be on the semiconductor wafer 22. In some embodiments, the radiation is reflected according to a pattern, such as exists on the mask 18, which may be a reflective mask. In some embodiments, third radiation is further reflected from a second peripheral collector section (e.g., the collector section 60C), may be reflected along the optical path, and may be reflected according to the pattern. The radiation may be EUV radiation.

Openings may be formed in the mask layer by removing regions of the mask layer exposed to the radiation. In some other embodiments, the openings are formed by removing regions of the mask layer not exposed to the radiation. Material of a layer underlying the mask layer may be removed. The material removed is in regions of the layer exposed by the openings in the mask layer. In some embodiments, the layer is a dielectric layer, a semiconductor layer, or other layer.

FIG. 10 is a flowchart of a process 1000 for forming a device in accordance with various embodiments. In some embodiments, the process 1000 for forming the device includes a number of operations (1010, 1020, 1030, 1040 and 1050). The process 1000 for forming the device will be further described according to one or more embodiments. It should be noted that the operations of the process 1000 may be rearranged or otherwise modified within the scope of the various aspects. It should further be noted that additional processes may be provided before, during, and after the process 1000, and that some other processes may be only briefly described herein. In some embodiments, the process 1000 is performed by the lithography exposure system 10 described in FIGS. 1A-8D.

In operation 1010, presence of debris on a collector is determined. For example, the drop 83 or drops 83A, 83B may be determined to be present on the collector 60. In operation 1010, respective positions and sizes (e.g., width, length, radius, height, or the like) of the drops 83, 83A, 83B may be determined. The determining may include capturing a digital image (e.g., a digital photograph or video still) of a surface of the collector 60 on which the drops 83, 83A, 83B are positioned. The determining may include analyzing the digital image. The analyzing may include, for example, performing edge detection to determine perimeters of the drops 83, 83A, 83B, and performing center calculation to determine centers of the drops 83, 83A, 83B. The centers may be centers of mass, e.g., in two dimensions, in some embodiments.

In some embodiments, the determining is performed based on one or more threshold conditions. The threshold conditions may include a cleanliness condition based on a selected level of contamination, such as tin debris buildup, on the collector section or segment. In some embodiments, the cleanliness condition is a contamination condition. In some embodiments, the contamination condition includes a percentage contamination condition, such as surface area of the mirror-surface of the first collector segment including contamination greater than about 1%, greater than about 5%, or another suitable percentage condition. In some embodiments, the contamination condition includes a reflectivity condition, such as reflectivity of the first collector segment being less than about 95% of original reflectivity (e.g., ideal or theoretical reflectivity), less than about 90% of the original reflectivity, or another suitable reflectivity condition. In some embodiments, the original reflectivity is reflectivity of the first collector segment immediately preceding or following installation into the sectional collector 60.

In some embodiments, the threshold condition may include a scheduling threshold. For example, the scheduling threshold may include a period of time since installation or previous cleaning of the collector section or segment, such as greater than about 14 days, greater than about one month, or another suitable period of time. The scheduling threshold may include total runtime of the system 10 since installation of the collector section or segment, such as greater than about 12 days, greater than about 3 weeks, or another suitable total runtime. The scheduling threshold may include a number of wafers processed by the system 10 since installation of the collector section or segment, such as greater than about 10,000 wafers, greater than about 100,000 wafers, or another suitable number of wafers.

In operation 1020, one or more of the drops 83, 83A, 83B (e.g., large debris) is broken into small debris (e.g., the removable debris 83P) by shockwaves, vibrations, or both. The shockwaves may be generated by a shockwave generator, as described with reference to FIGS. 5A and 5B. The vibrations may be generated by one or more vibrators, as described with reference to FIGS. 6A-7C.

In operation 1030, the small debris is removed to form a cleaned collector. In some embodiments, the small debris is the removable debris 83P. The small debris may be removed by one or more operations, such as providing an air flow directed at the removable debris, exhausting the removable debris, or both.

In operation 1040, a mask layer is deposited over a substrate. In some embodiments, the mask layer includes a photoresist layer that is sensitive to the EUV radiation 84. In some embodiments, the substrate is a semiconductor substrate, such as the semiconductor wafer 22 (see FIG. 1A). In some embodiments, the substrate is a layer overlying the semiconductor substrate, such as a dielectric layer, a metal layer, a hard mask layer, or other suitable layer. In some embodiments, the mask layer is deposited by spin coating or other suitable process.

In operation 1050, radiation is directed from the collector toward the mask layer according to a pattern. The radiation may include first radiation that is reflected from a central collector section (e.g., the collector section 60A), and second radiation that is reflected from a first peripheral collector section (e.g., the collector section 60B). The radiation is reflected along an optical path between the collector 60 and the mask layer, which may be on the semiconductor wafer 22. In some embodiments, the radiation is reflected according to a pattern, such as exists on the mask 18, which may be a reflective mask. In some embodiments, third radiation is further reflected from a second peripheral collector section (e.g., the collector section 60C), may be reflected along the optical path, and may be reflected according to the pattern. The radiation may be EUV radiation.

Openings may be formed in the mask layer by removing regions of the mask layer exposed to the radiation. In some other embodiments, the openings are formed by removing regions of the mask layer not exposed to the radiation. Material of a layer underlying the mask layer may be removed. The material removed is in regions of the layer exposed by the openings in the mask layer. In some embodiments, the layer is a dielectric layer, a semiconductor layer, or other layer.

Embodiments may provide advantages. Removal of debris on the collector improves reflectivity and slows degradation of mirrors in the lithography system. The embodiments described are able to remove large blocks of debris (e.g., tin) that are not uniformly distributed on the surface of the collector. Low temperature cleaner improves removal of debris by transitioning the debris from first phase debris to second phase debris. Use of shockwaves or vibrations may improve rate of breaking up of the large debris. The shockwaves improve precision of application of pressure in the large debris by controlling depth of the shockwaves. Machine learning improves selection of cleaning process parameters of the cleaner, shockwaves, and vibrations, which results in more efficient removal of the debris from the collector. As such, cleaning efficiency of the lithography system is improved, downtime is reduced, resulting in improved productivity, and cost associated with replacing collectors is reduced.

In accordance with at least one embodiment, a method includes: removing debris on a collector of a lithography equipment by changing physical structure of the debris with a cleaner, the cleaner being at a temperature less than about 13 degrees Celsius; forming a cleaned collector by exhausting the removable debris from the collector; and forming openings in a mask layer on a substrate by removing regions of the mask layer exposed to radiation from the cleaned collector.

In accordance with at least one embodiment, a method includes: forming removable debris by breaking up debris on a collector of a lithography equipment by vibration; forming a cleaned collector by removing the removable debris from the collector; and forming openings in a mask layer on a substrate by removing regions of the mask layer exposed to radiation from the cleaned collector.

In accordance with at least one embodiment, a method includes: forming removable debris by changing physical structure of debris on a collector of a lithography equipment by a process that changes a crystal phase of the debris, breaks the debris by vibration, or a combination thereof; generating at least one parameter of the process by a machine learning model; forming a cleaned collector by removing the removable debris from the collector; and forming openings in a mask layer on a substrate by removing regions of the mask layer exposed to radiation from the cleaned collector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   removing debris on a collector of a lithography equipment by changing physical structure of the debris with a cleaner; and
   forming a cleaned collector by exhausting the removable debris from the collector;
   wherein the removing debris includes flowing the cleaner through a gap in the collector such that the cleaner contacts a side of the debris facing a reflecting surface of the collector.

2. The method of claim 1, wherein the removing debris further includes:
   spraying the cleaner from a jet toward an upper surface of the debris.

3. The method of claim 1, wherein the cleaner includes H2.

4. The method of claim 1, wherein the removing debris includes:
   flowing the cleaner through a plurality of gaps in the collector such that the cleaner contacts a side of the debris facing a reflecting surface of the collector.

5. The method of claim 1, wherein the removing debris includes:
   spraying the cleaner from a jet toward another side of the debris, the another side facing away from the reflecting surface.

6. The method of claim 1, wherein:
   the flowing the cleaner through the gap is while a valve is closed, the valve being between the gap and an exhaust path; and
   the removing the removable debris includes exhausting the removable debris through the exhaust path while the valve is open.

7. The method of claim 1, wherein the collector includes a plurality of collector sections with gaps therebetween.

8. A method, comprising:
   forming removable debris by breaking up debris on a collector of a lithography equipment by vibration, wherein the vibration is by a first vibrator and a second vibrator, the first vibrator is attached to a first section of the collector, the second vibrator is attached to a second section of the collector, the first and second sections being separated from each other by a gap, and wherein the vibration changes the gap in a vertical direction; and
   forming a cleaned collector by removing the removable debris from the collector.

9. The method of claim 8, wherein the first vibrator and the second vibrator are attached to a non-reflecting surface of the collector.

10. The method of claim 8, wherein the first vibrator and the second vibrator are piezoelectric vibrators.

11. The method of claim 8, further comprising a third vibrator and a fourth vibrator.

12. The method of claim 8, wherein the vibration comprises generating a combination of primary (P-) waves and surface (S-) waves.

13. The method of claim 8, wherein the removing the removable debris includes exhausting the removable debris through the gap.

14. The method of claim 8, wherein the vibration is by a lithotripter.

15. A method, comprising:
   forming removable debris by changing physical structure of debris on a collector of a lithography equipment by a process that changes a crystal phase of the debris, breaks the debris by vibration, or a combination thereof;
   generating at least one parameter of the process by a machine learning model; and
   forming a cleaned collector by removing the removable debris from the collector; wherein the at least one parameter includes:
   flow speed of a cleaner expelled from a jet toward the debris; or
   a shock wave amplitude of a shock wave generator that generates the vibration,
   wherein the generating at least one parameter includes comparing first reflectivity of the collector with second reflectivity of the cleaned collector.

16. The method of claim 15, wherein the at least one parameter includes flow speed, flow direction, and flow duration of the cleaner expelled from the jet toward the debris.

17. The method of claim 15, wherein the at least one parameter includes a shock wave duration of a shock wave generator that generates the vibration.

18. The method of claim 15, wherein the at least one parameter includes direction and amplitude of at least one piezoelectric vibrator attached to a non-reflecting surface of the collector.

19. The method of claim 15, wherein the machine learning model is trained using historical cleaning data and historical process conditions data.

20. The method of claim 15, wherein the at least one parameter includes flow duration or flow direction of the cleaner expelled from the jet toward the debris.

\* \* \* \* \*